United States Patent [19]
Kawai et al.

[11] Patent Number: 5,748,315
[45] Date of Patent: May 5, 1998

[54] OPTICAL INTERFERENCE MEASURING APPARATUS AND METHOD FOR MEASURING DISPLACEMENT OF AN OBJECT HAVING AN OPTICAL PATH SEPARATING SYSTEM

[75] Inventors: Hitohsi Kawai, Kawasaki; Jun Kawakami, Yamato; Kouichi Tsukihara, Tokyo, all of Japan

[73] Assignee: Nikon Corporation, Tokyo, Japan

[21] Appl. No.: 621,362

[22] Filed: Mar. 25, 1996

[30] Foreign Application Priority Data

Mar. 23, 1995 [JP] Japan ................................. 7-064537
Mar. 7, 1996 [JP] Japan ................................. 8-079515

[51] Int. Cl.⁶ ............................................ G01B 9/02
[52] U.S. Cl. ..................... 356/349; 356/351; 356/358; 356/361
[58] Field of Search ................................. 356/349, 351, 356/358, 361, 364

[56] References Cited

U.S. PATENT DOCUMENTS

| | | | |
|---|---|---|---|
| 4,780,617 | 10/1988 | Umstate et al. | |
| 4,948,254 | 8/1990 | Ishida | 356/358 |
| 5,015,866 | 5/1991 | Hayashi | |
| 5,394,240 | 2/1995 | Matsumoto | 356/358 |
| 5,404,222 | 4/1995 | Lis | 356/349 |
| 5,537,209 | 7/1996 | Lis | 356/358 |
| 5,543,914 | 8/1996 | Henshaw et al. | 356/345 |

FOREIGN PATENT DOCUMENTS

| | | |
|---|---|---|
| 5-302809 | 11/1993 | Japan |
| 5-302810 | 11/1993 | Japan |
| 5302811 | 11/1993 | Japan |
| 6-94411 | 4/1994 | Japan |

*Primary Examiner*—Samuel A. Turner
*Attorney, Agent, or Firm*—Foley & Lardner

[57] ABSTRACT

The present invention relates to an optical interference measuring apparatus and method for measuring displacement of an object. The apparatus and method reduces the displacement-measurement error caused by changes of the refractive index of the atmosphere or the like, in a measurement optical path and a reference optical path, by suppressing crosstalk caused by unfavorable mixing of reference light and measurement light with each other, thereby improving accuracy in the measurement. The apparatus produces interference between a measurement light beam and a reference light beam. The measurement light is propagated through a measurement optical path including a measurement reflector, which is at least movable along the measurement optical path. The reference light is propagated through a reference optical path including a reference reflector. The interference occurs in a predetermined interference system, whereby the displacement of the measurement reflector can be measured. The apparatus, especially, comprises a light path separating system for spatially separating from each other the optical path from the measurement reflector to the interference system, through which the measurement light is propagated, and the optical path from the reference reflector to the interference system, through which the reference light is propagated.

29 Claims, 16 Drawing Sheets

OPTICAL INTERFERENCE MEASURING APPARATUS AND METHOD FOR MEASURING DISPLACEMENT OF AN OBJECT HAVING AN OPTICAL PATH SEPARATING SYSTEM

BACKGROUND OF THE INVENTION

1. Field of the Invention

The present invention relates to an optical interference measuring apparatus and optical interference measuring method for measuring displacement of an object by interference of lightwave, in which two light components having frequencies different from each other are used so as to correct errors caused by change of refractive index of the atmosphere or the like in the measurement light path and reference light path, thereby realizing measurement of displacement with a high accuracy.

2. Related Background Art

An example of the conventional measuring apparatus is disclosed in U.S. Pat. No. 5,404,222. When the displacement of an object is to be measured by way of the atmosphere, this measuring apparatus uses homodyne detection to detect the error caused by change of refractive index of the atmosphere, thereby correcting the displacement information of the object. In this measuring apparatus, however, since thus detected error also includes an error signal due to change of intensity of the light to be detected by its photodetector, it is difficult to correctly measure the error caused by change of refractive index of the atmosphere.

Also, in the measuring apparatus disclosed in U.S. Pat. No. 4,948,254, since the detected error also includes an error signal due to change of intensity of the light to be detected by its photodetector, it is difficult to correctly measure the error.

SUMMARY OF THE INVENTION

The object of the present invention is to provide an optical interference measuring apparatus and optical interfering method configured such that, in order to correct the displacement-measurement error caused by change of refractive index of the atmosphere or the like in the measurement light path and reference light path, crosstalk caused by undesirable mixing of reference light and measurement light with each other is suppressed so as to improve accuracy in the measurement.

In the optical interference measuring apparatus and method in accordance with the present invention, measurement light propagated through a measurement light path including a measurement reflector (movable mirror) which is at least movable along the measurement light path and reference light propagated through a reference light path including a reference reflector (stationary mirror or reference mirror) are made to interfere with each other, thereby the displacement of the measurement reflector is measured.

Specifically, the optical interference measuring apparatus in accordance with the present invention comprises, when the displacement of the measurement reflector is to be measured by heterodyne interferometry as shown in FIG. 4, for example, a light emitting system for emitting, along an identical light path, first light having predetermined frequencies $\omega_1$ and $\omega_{1a}$ and second light and third light respectively having frequencies $\omega_2$ and $\omega_3$ which are different from each other; a main polarization separator 4 which divides the first light into a first measurement light component (having the frequency $\omega_1$) included in measurement light introduced into a measurement light path and a first reference light component (having the frequency $\omega_{1a}$) included in reference light introduced into a reference light path which are polarized light components different from each other, divides the second light having the frequency $\omega_2$ into a second measurement light component (having the frequency $\omega_2$) included in the measurement light and a second reference light component (having the frequency $\omega_2$) included in the reference light which are polarized light components different from each other, and divides the third light having the frequency $\omega_3$ into a third measurement light component (having the frequency $\omega_3$) included in the measurement light and a third reference light component (having the frequency $\omega_3$) included in the reference light which are polarized light components different from each other; and a frequency separating system for separating, in terms of frequency, the measurement light propagated through the measurement light path into the first measurement light component and the second and third measurement light components, while separating, in terms of frequency, the reference light propagated through the reference light path into the first reference light component and the second and third reference light components.

Here, when the displacement of the measurement reflector is to be measured by homodyne interferometry, light having a single frequency may be used as the first light. Here, light having a plurality of frequencies $\omega_1$ and $\omega_{1a}$ ($\omega_{1a}=\omega_1+\Delta\omega_1$) which are slightly different from each other will be referred to as "light in the proximity of frequency $\omega_1$" in the following. Similarly, light in the proximity of frequency $\omega_2$ and light in the proximity of frequency $\omega_3$ respectively refer to light having a plurality of frequencies slightly different from each other including the frequency $\omega_2$ and light having a plurality of frequencies slightly different from each other including the frequency $\omega_3$. Also, this light emitting system may comprise a plurality of light sources 1 and 12 as shown in FIG. 4 or a single light source 101 as shown in FIGS. 15 and 16. Further, this frequency separating system may be constituted by a frequency separator 7 as shown in FIG. 4 or may comprise a plurality of frequency separators 7 and 42 as shown in FIG. 7.

Also, this apparatus further comprises a first interference light generating system for generating first interference light from the first reference light component and the first measurement light component; a second interference light generating system for generating second interference light by making one of the frequencies of the second measurement light component and third measurement light component substantially coincide with the other frequency; and a third interference light generating system for generating third interference light by making one of the frequencies of the second reference light component and third reference light component substantially coincide with the other frequency. Here, the first interference light generating system includes at least a mirror M, a polarization beam splitter 15, and a polarizing device 31; the second interference light generating system includes at least a frequency converter 8; and the third interference light generating system includes at least a frequency converter 9.

In particular, this apparatus comprises, with respect to at least the second light and third light, a light path separating mechanism for spatially separating the light path of the measurement light component propagated through the measurement light path toward the second interference light generating system and the light path of the reference light component propagated through the reference light path toward the third interference light generating system from each other. As shown in FIG. 5, this light path separating mechanism includes at least a measurement reflector 6 (movable mirror); a reference reflector 5 (stationary mirror) disposed at a position where measurement light L3 emitted from the main polarization separator 4 after having propagated through the measurement light path and reference light L2 emitted from the main polarization separator 4 after having propagated through the reference light path are spatially separated from each other; and the frequency separating system 7. Accordingly, the measurement light L3 and the reference light L2 which are emitted from the main polarization separator 4 and independent from each other are introduced into the frequency separating system 7. Then, along the respective light paths which are spatially separated from each other, first measurement light component L31 and first reference light component L21 which are separated by the frequency separating system 7 in terms of frequency are introduced into the first interference light generating system. Second and third measurement light components L32 separated by the frequency separating system 7 in terms of frequency are introduced into the second interference light generating system. Second and third reference light components L23 separated by the frequency separating system 7 in terms of frequency are introduced into the third interference light generating system. Here, in general, the beam diameter of light propagated through a predetermined light path is defined by the half width obtained from the optical intensity distribution of the luminous flux (intensity distribution in a direction perpendicular to the light path). Accordingly, that two light components are spatially separated from each other refers to a state in which two light components specified by the beam diameters defined above are spaced from each other by a predetermined distance.

In the light path dividing mechanism having a basic configuration such as that mentioned above, each of the measurement reflector 6 and reference reflector is preferably a corner-cube prism. The measurement reflector 6 and the reference reflector 5 are respectively disposed at positions where an incident position La, at which the measurement light L3 reflected by the measurement reflector 6 is incident on the main polarization separator 4, and an incident position Lb, at which the reference light L2 reflected by the reference reflector 5 is incident on the main polarization separator 4, can be prevented from substantially overlapping each other. Here, that the incident positions do not substantially overlap each other is equivalent to that the measurement light L3 emitted from the main polarization separator 4 after having propagated through the measurement light path and the reference light L2 emitted from the main polarization separator 4 after having propagated through the reference light path do not propagate through the same light path. Accordingly, in this light path separating mechanism, the reference reflector 5 is disposed at a position which is shifted, by a predetermined distance in a direction indicated by arrow D3 (direction in parallel to the measurement light path) in FIG. 5, from a position (position indicated by dashed line in the drawing where a reference reflector 500 is disposed) at which the reference light is incident at a position Lc which substantially overlaps the incident position La of the measurement light L3.

Also, this apparatus further comprises a calculator 19 which, based on information about change of refractive index in the measurement light path and reference light path measured from the second interference light and third interference light, corrects information about displacement of the measurement reflector 6 obtained from the first interference light so as to determine the amount of displacement of the measurement reflector 6.

The optical interference measuring method in accordance with the present invention is realized by the optical interference measuring apparatus with the basic configuration mentioned above. Also, in the optical interference measuring apparatus in accordance with the present invention, due to the above-mentioned configuration, the reference light containing at least the second reference light component (frequency $\omega_2$) and third reference light component (frequency $\omega_3$) and the measurement light containing at least the second measurement light component (frequency $\omega_2$) and third measurement light component (frequency $\omega_3$) are independent from each other without overlapping each other. As a result, crosstalk between the reference light and the measurement light for correcting the influence due to the change of refractive index in the measurement light path and reference light path is substantially prevented from occurring, thereby enabling highly accurate measurement.

Here, "measurement light path" refers to an optical path through which the measurement light emitted from the light emitting system and then separated by the main polarization separator 4 propagates from the main polarization separator 4 to the frequency separating system (the first frequency separator 7 or second frequency separator 42) at least by way of the measurement reflector 6. Also, "reference light path" refers to an optical path through which the reference light emitted from the light emitting system and then separated by the main polarization separator 4 propagates from the main polarization separator 4 to the frequency separating system (the first frequency separator 7) at least by way of the reference reflector 5.

Next, as shown in FIG. 7, the frequency separating system may be configured so as to include the second frequency separator 42 for separating the measurement light propagated through the measurement light path into the first measurement light component and the second and third measurement light components in terms of frequency and the first frequency separator 7 for separating the reference light propagated through the reference light path into the first reference light component and the second and third reference light components in terms of frequency. In this case, at least one of the first frequency separator 7 and the second frequency separator 42 is preferably disposed in one of the light path from the measurement reflector 6 to the main polarization separator 4 and the light path from the reference reflector 5 to the main polarization separator 4. Also, the first frequency separator 7 and the second frequency separator 42 are included in the light path separating mechanism.

Preferably, in this embodiment shown in FIG. 7, the measurement reflector 6 is a corner-cube prism, the second frequency separator 42 is a dichroic mirror, which is disposed in the light path of the measurement light reflected by the measurement reflector 6 and has a characteristic such that the second and third measurement light components in the measurement light are reflected thereby while the first measurement light component in the measurement light is transmitted therethrough, and the first frequency separator 7 is a dichroic mirror which has a characteristic such that the second and third reference light components in the reference light are reflected thereby while the first reference light component in the reference light is transmitted therethrough.

Next, as shown in FIG. 8, the optical interference measuring apparatus may comprise a relay optical system for reciprocating the reference light containing the first, second, and third reference light components along the reference light path at least twice while reciprocating the measurement light containing the first, second, and third measurement light components along the measurement light path the same times as the reference light. This relay light path comprises a first relay reflector 106A which reflects the reference light, which has arrived there by way of a main polarization separator 103 after having reciprocated through the reference light path once, so as to guide it to a reference reflector 104 by way of the main polarization separator 103 again, while reflecting the measurement light, which has arrived there by way of the main polarization separator 103 after having reciprocated through the measurement light path once, so as to guide it to a measurement reflector 105 by way of the main polarization separator 103 again. This first relay reflector 106A is disposed at a position where the light path of the reference light between the first relay reflector 106A and the main polarization separator 103 and the light path of the measurement light between the first relay reflector 106A and the main polarization separator 103 can be spatially separated from each other.

Also, as shown in FIG. 9, the relay optical system may comprise a first polarization direction converter 125A for converting the polarization direction of the reference light reciprocating through the reference light path between the reference reflector 104 and the main polarization separator 103 into a predetermined polarization direction and a second polarization direction converter 126A for converting the polarization direction of the measurement light reciprocating through the measurement light path between the measurement reflector 105 and the main polarization separator 103 into a predetermined polarization direction. Preferably, in this case, the first relay reflector is a corner-cube prism, the first polarization direction converter is a ¼-wave plate, and the second polarization direction converter is a ¼-wave plate. Also, as shown in FIG. 13, the reference reflector 104 may be constituted by a plurality of reference reflectors 104a and 104b, whereas at least one of the reference reflector 104 and measurement reflector 105 may be a plane mirror.

Further, as shown in FIG. 11, the relay optical system may comprise a first relay polarization separator 128A for changing the light path of the measurement light, which has arrived there by way of the main polarization separator 103 after having reciprocated through the measurement light path once, and a second relay reflector 130A for reflecting the measurement light, whose light path has been changed by the first relay polarization separator 128A, so as to guide it to the first relay polarization separator 128A again. Preferably, in this case, the second relay optical system comprises a first eliminating mechanism 134 for eliminating stray light (an undesirable polarized light component) mixed into the reference light propagated through the light path between the first relay polarization separator 128A and the first relay reflector 106A and a second eliminating mechanism 129A for eliminating stray light (an undesirable polarized light component) mixed into the measurement light propagated through the light path between the first relay polarization separator 128A and the second relay reflector 130A. Specifically, the first eliminating mechanism 134 is a stop through which only the reference light transmitted through the first relay polarization separator 128A passes, whereas the second eliminating mechanism 129A is a polarization beam splitter which guides, to the outside of a predetermined light path, only the reference light reflected by the first relay polarization separator 128A.

Next, as shown in FIG. 12, the relay optical system may be constituted by a first partial relay optical system for reflecting the reference light, which has reciprocated through the reference light path once, so as to guide it to a reference reflector 139 (plane mirror) without by way of the main polarization separator 103 and a second partial relay optical system for reflecting the measurement light, which has reciprocated through the measurement light path once, so as to guide it to a measurement reflector 127 (plane mirror) without by way of the main polarization separator 103. In this case, the first partial relay optical system includes a second relay polarization separator 136 disposed in the light path between the reference reflector 139 and the main polarization separator 103, a first ¼-wave plate 125B disposed in the light path between the second relay polarization separator 136 and the reference reflector 139, and a third relay reflector 106B for reflecting the reference light, which has arrived there by way of the second relay polarization separator 136 after having reciprocated through the reference light path once, so as to guide it to the reference reflector 139 by way of the second relay polarization separator 136 and the first ¼-wave plate 125B; whereas the second partial relay optical system includes a third relay polarization separator 135 disposed in the light path between the measurement reflector 127 and the main polarization separator 103, a second ¼-wave plate 126B disposed in the light path between the third relay polarization separator 135 and the measurement reflector 127, and a fourth relay reflector 130B for reflecting the measurement light, which has arrived there by way of the third relay polarization separator 135 after having reciprocated through the measurement light path once, so as to guide it to the measurement reflector 127 by way of the third relay polarization separator 135 and the second ¼-wave plate 126B.

In particular, the first partial relay optical system comprises a third eliminating mechanism for eliminating stray light (an undesirable polarized light component) mixed into the reference light propagated through the light path between the second relay polarization separator 136 and the third relay reflector 106B; whereas the second partial relay optical system comprises a fourth eliminating mechanism for eliminating stray light (an undesirable polarized light component) mixed into the measurement light propagated through the light path between the third relay polarization separator 135 and the fourth relay reflector 130B. Specifically, the third eliminating mechanism comprises polarization beam splitters 137 and 138 for guiding, to the outside of a predetermined light path, the measurement light which has arrived there by way of the second relay polarization separator 136; whereas the fourth eliminating mechanism comprises polarization beam splitters 128B and 129B for guiding, to the outside of a predetermined light path, the reference light which has arrived there by way of the third relay polarization separator 135.

Here, in the above-mentioned light emitting system, the first light includes light components which respectively have frequencies $\omega_1$ and $\omega_{1a}$ slightly different from each other and whose polarization directions are orthogonal to each other. Accordingly, the first light incident on the main polarization separator 4 is separated into light with the frequency $\omega_1$, which becomes the first measurement light component, and light with the frequency $\omega_{1a}$, which becomes the first reference light component.

Also, for example as shown in FIG. 4, the light emitting system may be configured with a first light source section (including a length-measuring light source 12) for outputting the first light, a second light source section for outputting the second light and third light; and a frequency coupling member 3 for coupling the second light and third light from the second light source section and the first light from the first light source section together so as to guide them to an identical light path. In this case, the second light source section comprises a light source 1 for outputting the second light and a first frequency converter 2 for converting a part of the second light from the first light source 1 into one of harmonic waves (including second, third, and fourth harmonic waves, or the like) thereof and outputting this harmonic wave as the third light; the second interference light generating system comprises a second frequency converter 8 for converting the second measurement light component, which has been propagated through the measurement light path, into one of harmonic waves thereof; and the third interference light generating system comprises a third frequency converter 9 for converting the second measurement light component, which has been propagated through the reference light path, into one of harmonic waves thereof. Here, each of the first, second, and third frequency converters 2, 8, and 9 is a non-linear optical crystal which converts a part of incident light into one of harmonic waves such as the second, third, or fourth harmonic wave thereof. Though the non-linear optical crystals in the embodiments explained herein are restricted to those converting a part of incident light into the second harmonic wave thereof for the convenience of explanation, they should not be restricted thereto in particular.

As an adopted example, as shown in FIG. 16, the second light source section may comprise a frequency shifting section for slightly shifting the frequency of one of the second light and third light. Also, the light emitting system may comprise a third light source section (including a single light source 101 shown in FIGS. 15 and 16, for example) which outputs, together with the first light, one of the second light and third light having a frequency identical to that of the first light.

DETAILED DESCRIPTION OF THE PREFERRED EMBODIMENTS

Prior to specific explanation of embodiments, the principle of the displacement measurement by the optical interference measuring apparatus and method in accordance with the present invention will be explained with reference to FIG. 1. This drawing shows a schematic configuration of an optical interference measuring apparatus for explaining the principle of the displacement measurement.

As a method for correcting the length-measuring error caused by change of refractive index of the air in the measurement light path and reference light path, there may be considered a method in which the temperature, pressure, and humidity of the air in the measurement light path and reference light path are measured by an air sensor and then, on the basis of the result of this measurement, the wavelength of the measurement light propagated through the measurement light path and reference light path is corrected. This is due to the fact that the wavelength of the measurement light propagated through the measurement light path and reference light path is an amount which depends on the temperature, pressure, and humidity of the air in the measurement light path and reference light path. However, it is not practical to assume a state in which the refractive index of the air uniformly changes along the measurement light path and reference light path. In reality, since the refractive index of the air changes locally along the measurement light path and reference light path, it is difficult to accurately correct the length-measuring error caused by a change of refractive index of the air, when the result of measurement obtained by the air sensor is utilized as mentioned above.

Accordingly, in the optical interference measuring apparatus in accordance with the present invention, two light components having frequencies different from each other are used to detect a length-measuring error caused by change of refractive index of the air and correct, on the basis of thus detected error information, the measured amount of displacement.

Figure 1:
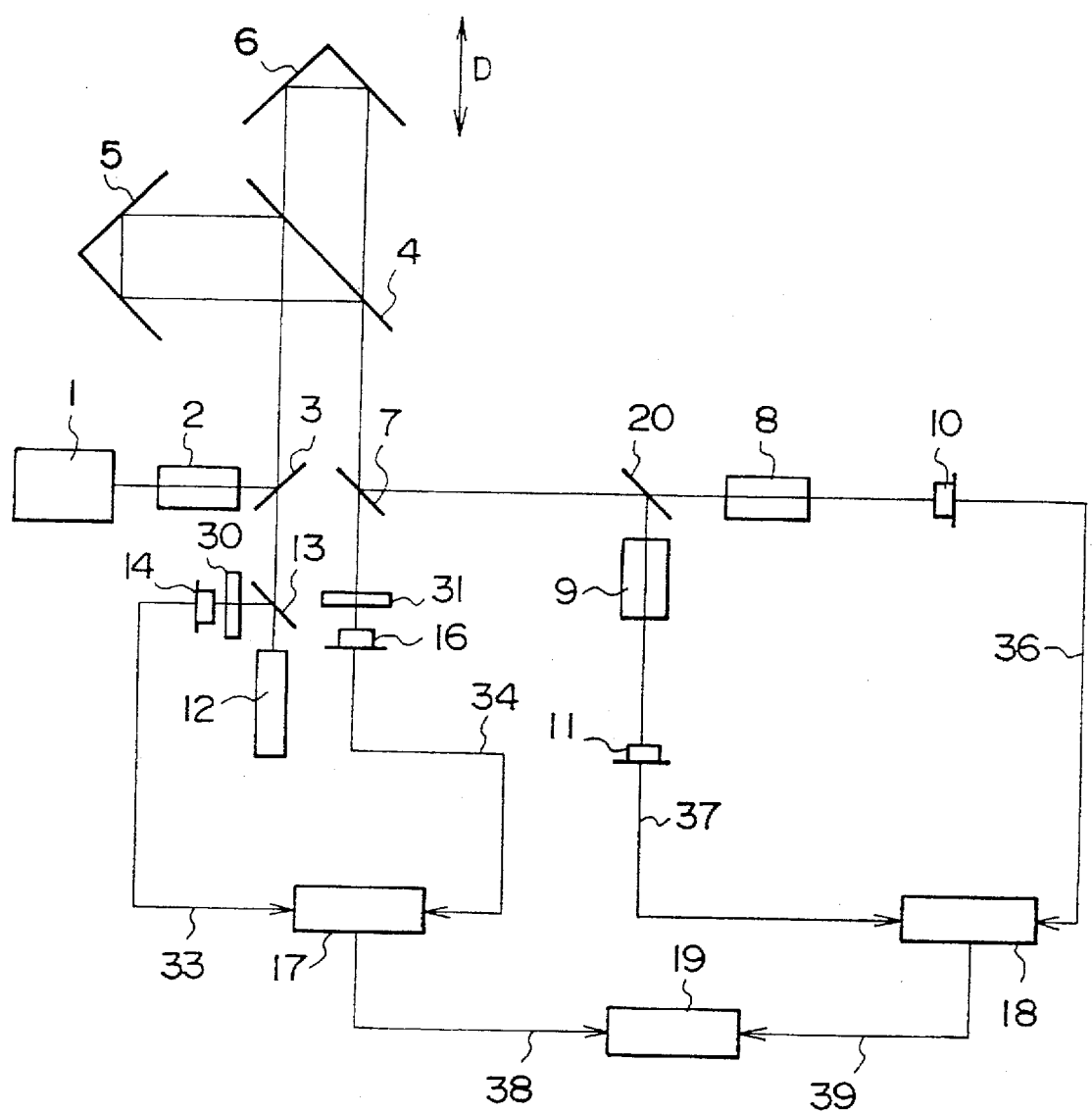
FIG. 1 is a view showing a schematic configuration of a comparative example which explains the principle of displacement measurement in the optical interference measuring apparatus and optical interference measuring method in accordance with the present invention as well as configurational characteristics of the optical interference measuring apparatus.

First, FIG. 1 shows an apparatus for measuring, in terms of length, a displacement D of a movable mirror 6 (measurement reflector) in the direction of an optical axis (direction of arrow in the drawing). A length-measuring light source 12 emits light (first light, referred to as "light in the proximity of frequency $\omega_1$" hereinafter) including light with a frequency $\omega_1$ and light with a frequency $\omega_{1a}$ ($\omega_{1a}=\omega_1+\Delta\omega_1$). These two light components respectively have frequencies slightly different from each other and polarization directions orthogonal to each other.

By way of a beam splitter 13, these two light components having frequencies different from each other are incident on a polarization beam splitter 4 (main polarization separator) and thereby separated into light with the frequency $\omega_{1a}$, which becomes a first reference light component and light with the frequency $\omega_1$, which becomes a first measurement light component. This first reference light component (light with the frequency $\omega_{1a}$) is reflected by a stationary mirror 5 (reference reflector) and then returns to the polarization beam splitter 4. The first measurement light component (light with the frequency $\omega_1$) is reflected by a movable mirror 6 (measurement reflector) and then returns to the polarization beam splitter 4.

The first measurement light component and first reference light component returned to the polarization beam splitter 4 are emitted therefrom along an identical light path. The first measurement light component and first reference light component emitted from the polarization beam splitter 4 along the identical light path interfere with each other by way of a polarizing device 31 (first interference generating system). Specifically, the polarizing device 31 is a polarizer which is disposed with an inclination of 45° with respect to each of the polarization direction of the first reference light component and the polarization direction of the first measurement light component. Interference light (first interference light) generated by way of the polarizing device 31 is received by a photoelectric converter 16. The photoelectric converter 16 outputs a converted measurement beat signal (frequency $\Delta\omega_1$) 34, which is then input into a phase meter 17.

On the other hand, the first reference light component and first measurement light component emitted from the length-measuring light source 12 are partially reflected by the beam splitter 13 and then interfere with each other by way of a polarizing device 30. Interference light generated by way of the polarizing device 30 is detected by a photoelectric converter 14 and then input into the phase meter 17 as a reference beat signal (frequency $\Delta\omega_1$) 33. Here, like the polarizing device 31, the polarizing device 30 is a polarizer for polarizing two light components having frequencies different from each other. Accordingly, the phase meter 17 measures a change in phase of the measurement beat signal 34 with respect to the reference signal 33 so as to determine a displacement Dm of the movable mirror 6 and then outputs information about this displacement, as a signal 38, to a calculator 19.

Further, the optical interference measurement apparatus of FIG. 1 couples two laser beams (second light and third light) respectively having frequencies $\omega_2$ (fundamental) and $\omega_3$ (second harmonic wave: $2\omega_2=\omega_2$) together on the light path identical to that of the light (first light) emitted from the length-measuring light source 12. Due to these two laser beams having frequencies different from each other, change of refractive index of the air (or other gases, etc.) in the measurement light path of the length-measuring interferometer can be determined.

In the optical interference measuring apparatus of FIG. 1, a part of the light with the frequency $\omega_2$ is transmitted, as it is, through a non-linear optical crystal such as a second harmonic wave generating device 2 (referred to as "SHG" device hereinafter), while the rest thereof is converted by the SHG device 2 into light with the frequency $\omega_3$ ($2\omega_2=\omega_3$), thereby the second light and the third light can be generated. By a frequency coupling device 3 (frequency coupling member) made of a dichroic mirror, for example, the light with the frequency $\omega_2$ and the light with the frequency $\omega_3$ are coupled, on the identical light path, with the light in the proximity of frequency $\omega_1$ (first light including the first reference light component and the first measurement light component) emitted from the length-measuring light source 12. Thus formed composite light is made incident on a polarization separating device 4 (main polarization separator) made of a polarization beam splitter, for example, by way of the same light path. The light in the proximity of frequency $\omega_1$ herein includes not only the light with the frequency $\omega_1$ but also light with a frequency $\omega_{1a}$ ($\omega_{1a}=\omega_1\pm\Delta\omega_1$) which is slightly different from the frequency $\omega_1$. Similarly, each of the light in the proximity of frequency $\omega_2$ and the light in the proximity of frequency $\omega_3$ may refer to a plurality of light components. Further, as mentioned above, the non-linear optical crystal may generate not only the second harmonic wave but also the third or fourth harmonic wave or the like, although generating the second harmonic wave is disclosed in the embodiments herein as a typical example thereof.

The light with the frequency $\omega_2$ and the light with the frequency $\omega_3$ are divided by the polarization dividing device 4 into light (reference light component) reflected thereby toward the stationary mirror 5 (reference reflector) and light (measurement light component) transmitted therethrough toward the movable mirror 6 (measurement reflector). Accordingly, the reference light includes, in addition to the first reference light component (frequency $\omega_{1a}$), a second reference light component (frequency $\omega_2$) and a third reference light component (frequency $\omega_3$); whereas the measurement light includes, in addition to the first measurement light component (frequency $\omega_1$), a second measurement light component (frequency $\omega_2$) and a third measurement light component (frequency $\omega_3$). Thereafter, the reference light and the measurement light respectively reflected by the stationary mirror 5 and the movable mirror 6 are made incident on the polarization separating device 4 and then coupled together so as to be emitted along an identical light path.

The light with the frequency $\omega_2$ (second reference light component and second measurement light component) and the light with the frequency $\omega_3$ (third reference light component and third measurement light component), coupled together by the polarization separating device 4, are reflected by a frequency separating device 7 (first frequency separator included in a frequency separating system) made of a dichroic mirror, for example. Accordingly, the light with the frequency $\omega_2$ and the light with the frequency $\omega_3$ are separated from the light with the frequency $\omega_1$ (first reference light component and first measurement light component) and transmitted through the frequency separating device 7, so as to be made incident on a polarization separating device 20 made of a polarization beam splitter, for example. The polarization separating device 20 transmits therethrough the second and third measurement light components (light with the frequency $\omega_2$ and light with the frequency $\omega_3$) reflected by the movable mirror 6, while reflecting the second and third reference light components (light with the frequency $\omega_2$ and light with the frequency $\omega_3$) reflected by the stationary mirror 5.

Of the second and third measurement light components transmitted through the polarization separating device 20, the second measurement light component with the frequency $\omega_2$ is converted by the SHG device 8 (second harmonic wave generating device) into light with the frequency $\omega_3$ ($2\omega_2=\omega_3$). On the other hand, the third measurement light component with the frequency $\omega_3$ is transmitted through the SHG device 8 as it is. As a result, the second measurement light component converted by the SHG device 8 from the frequency $\omega_2$ into the frequency $\omega_3$ and the third measurement light component with the frequency $\omega_3$ reflected by the movable mirror 6 interfere with each other (second interference light generating system). The resulting interference light (second interference light) is detected by a photoelectric converter 10 as an electric signal.

Also, of the second reference light component with the frequency $\omega_2$, and third reference light component with the frequency $\omega_3$ reflected by the polarization separating device 20, the second reference light component is converted by an SHG device 9 (second harmonic wave generating device) from the frequency $\omega_2$ into the frequency $\omega_3$. On the other hand, the third reference light component with the frequency $\omega_3$ is transmitted through the SHG device 9 as it is. As a result, the second reference light component conducted by the SHG device 11 from the frequency $\omega_2$ into the frequency $\omega_3$ and the third reference light component with the frequency $\omega_3$ reflected by the stationary mirror 5 interfere with each other (third interference light generating system). The resulting interference light (third interference light) is detected by a photoelectric converter 11 as an electric signal.

Interference signals 36 and 37 respectively detected by the photoelectric converters 10 and 11 are input into a phase meter 18. The phase meter 18 detects a change in phase of the interference signal 36 (measurement signal) with respect to the interference signal 37 (reference signal). Accordingly, the difference between light path length change $D(\omega_3)$ with respect to the light with the frequency $\omega_3$ and light path length change $D(\omega_2)$ with respect to the light with the frequency $\omega_2$, namely, $(D(\omega_3)-D(\omega_2))$ can be determined. Further, a signal 39 concerning $(D(\omega_3)-D(\omega_2))$ determined by the phase meter 18 is supplied to the calculator 19. Accordingly, the calculator 19 can correct the displacement Dm of the movable mirror 6 measured by the length-measuring interferometer using the length-measuring light source 12, thereby a true displacement (geometric displacement) D can be determined.

Next, correction from the displacement Dm of the movable mirror 6 into the true displacement (geometric displacement) D will be explained.

Light path length changes $D(\omega_1)$, $D(\omega_2)$, and $D(\omega_3)$ of the measurement light path with respect to light components with frequencies $\omega_1$, $\omega_2$, and $\omega_3$ are respectively expressed by the following equations:

$$D(\omega_1)=(1+N \cdot F(\omega_1)) \cdot D \quad (1)$$

$$D(\omega_2)=(1+N \cdot F(\omega_2)) \cdot D \quad (2)$$

$$D(\omega_3)=(1+N \cdot F(\omega_3)) \cdot D \quad (3)$$

Here, D is a geometric displacement and N is a density of the air in the measurement light path. Also, $F(\omega)$ is a function which solely depends on frequency $\omega$ of light while being independent from the density of the air when the constitutional ratio of the air is unchanged. From the above-mentioned equations (1) to (3), the geometric displacement D is given by the following equation:

$$D=D(\omega_1)-A(D(\omega_3)-D(\omega_2)) \quad (4)$$

wherein:

$$A=F(\omega_1)/(F(\omega_3)-F(\omega_2))$$

As mentioned above, $(D(\omega_3)-D(\omega_2))$ in the second term on the right side of equation (4) is obtained from the phase meter 18. Also, $D(\omega_1)$ in the first term on the left side of equation (4) is obtained from the phase meter 17. Accordingly, based on the output signal 38 of the phase meter 17 and the output signal 39 of the phase meter 18, the calculator 19 can correct the displacement $D(\omega_1)$ measured by the length-measuring interferometer, thereby the true displacement D can be determined.

In the optical interference measuring apparatus of FIG. 1, however, the measurement light component including the light with the frequency $\omega_2$ and light with the frequency $\omega_3$, reflected by the movable mirror 6 and the reference light component including the light with the frequency $\omega_2$ and light with the frequency $\omega_3$ reflected by the stationary mirror 5 are once coupled together by the polarization separating device 4 and then separated from each other by the polarization separating device 20. Accordingly, due to incompleteness in polarization characteristics of the polarization separating device 20, the S/N ratio in measurement may deteriorate, thereby lowering the accuracy in measurement.

In the following, explanation will be provided for the lowering of the accuracy in measurement caused by the incompleteness in polarization characteristics of the polarization separating device 20.

As mentioned above, the light with the frequency $\omega_2$ and the light with the frequency $\omega_3$ separated by the polarization separating device 20 are detected as a phase difference between the interference signal of the light with the frequency $\omega_2$ and the light with the frequency $\omega_3$ with respect to each other detected by the photoelectric converter 11 and the interference signal of the light with the frequency $\omega_2$ and the light with the frequency $\omega_3$ with respect to each other detected by the photoelectric converter 10. Accordingly, when the light incident on the polarization separating device 20 is not accurately separated into the reference light component reflected by the stationary mirror 5 and the measurement light component reflected by the movable mirror 6, light other than the light to be detected may enter the photoelectric converters 10 and 11 as stray light. As a result, crosstalk caused by the mixed stray light may be generated between the light paths, thereby lowering the accuracy in measurement.

Actually, it is difficult to attain a configuration such that the polarization separating device, composed of a polarization beam splitter or the like, functions similarly with respect to a plurality of light components having frequencies different from each other, namely, such that the polarization separating device can function ideally. Accordingly, both of the light with the frequency $\omega_2$ and the light with the frequency $\omega_3$ cannot be accurately separated into the reference light component and the measurement light component, thereby the mixed stray light may influence the accuracy in measurement. Also, as a higher accuracy is to be attained in the polarization separating device in order to attain its ideal function, the cost for its manufacture may increase.

Figure 2:
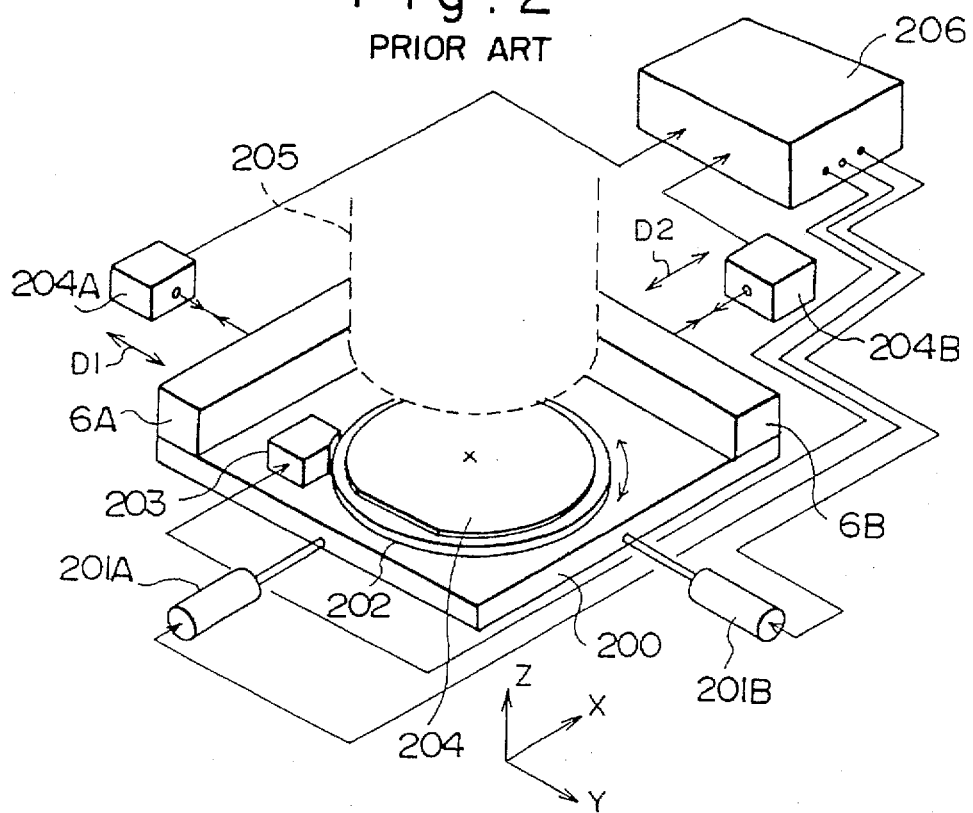
FIG. 2 is a perspective view for explaining an applied example of displacement measurement in which a optical interference measuring apparatus in accordance with the present invention is utilized.
Figure 3:
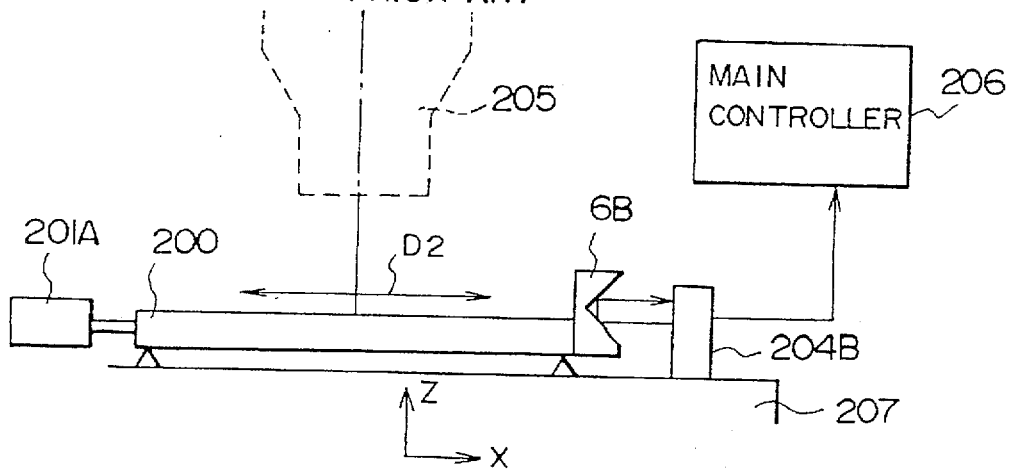
FIG. 3 is a plan view for explaining an applied example of displacement measurement in which an optical interference measuring apparatus in accordance with the present invention is utilized.

Next, an adopted example of the optical interference measuring apparatus will be explained. FIGS. 2 and 3 are views showing a schematic configuration of a part (wafer stage mechanism) of an exposure apparatus.

In general, the wafer stage mechanism of the exposure apparatus comprises a first stage 200 which is movable in X—Y directions in the drawings and a rotatable second stage 202 disposed on the first stage 200. A wafer 204 is disposed on the second stage 202 such that an image of a predetermined pattern on a mask (e.g., reticle) is formed thereon by way of a projection optical system 205. A motor 201B moves the first stage 200 to a predetermined position along the Y direction according to a control signal from a main controller 206, whereas a motor 201A moves the first stage 200 to a predetermined position along the X direction according to a control signal from the main controller 206. A motor 203 rotates the second stage 202 by a predetermined angle according to a control signal from the main controller 206.

A movable mirror 6A is attached to the first stage 200 (object) in parallel to the X direction in the drawings so as to be movable together with the first stage 200. On the other hand, a main part of an optical interference measuring apparatus is disposed at a predetermined position facing the movable mirror 6A, while being accommodated in a case 204A, so as to constitute a first optical interference measuring apparatus. Similarly, a movable mirror 6B is attached to the first stage 200 (object) in parallel to the Y direction in the drawings so as to be movable together with the first stage 200. Also, a main part of an optical interference measuring apparatus is disposed at a predetermined position facing the movable mirror 6B, while being accommodated in a case 204B, so as to constitute a second optical interference measuring apparatus.

According to the foregoing configuration, the first optical interference measuring apparatus measures displacement D1 of the first stage 200 (displacement of the movable mirror 6A) in the Y direction, while the second optical interference measuring apparatus measures displacement D2 of the first stage 200 in the X direction. For example, in the case where the position of the wafer stage at the time when the alignment of the wafer 204 is completed or the position of the wafer stage before its movement is defined as a reference position, the wafer stage (position of the first stage 200 which is the object) can be correctly specified by the reference position and the amounts of displacement obtained from the first and second optical interference measuring apparatuses. Accordingly, the main controller 206 can drive and control the first stage 200, with high accuracy, on the basis of the displacement information from these first and second optical interference measuring apparatuses.

The detailed configuration of the above-mentioned wafer stage section is disclosed in U.S. Pat. Nos. 4,780,617, 5,015,866, and 5,404,222, for example.

In the following, the embodiments of the optical interference measuring apparatus in accordance with the present invention will be explained with reference to FIGS. 4 to 17.

Figure 4:
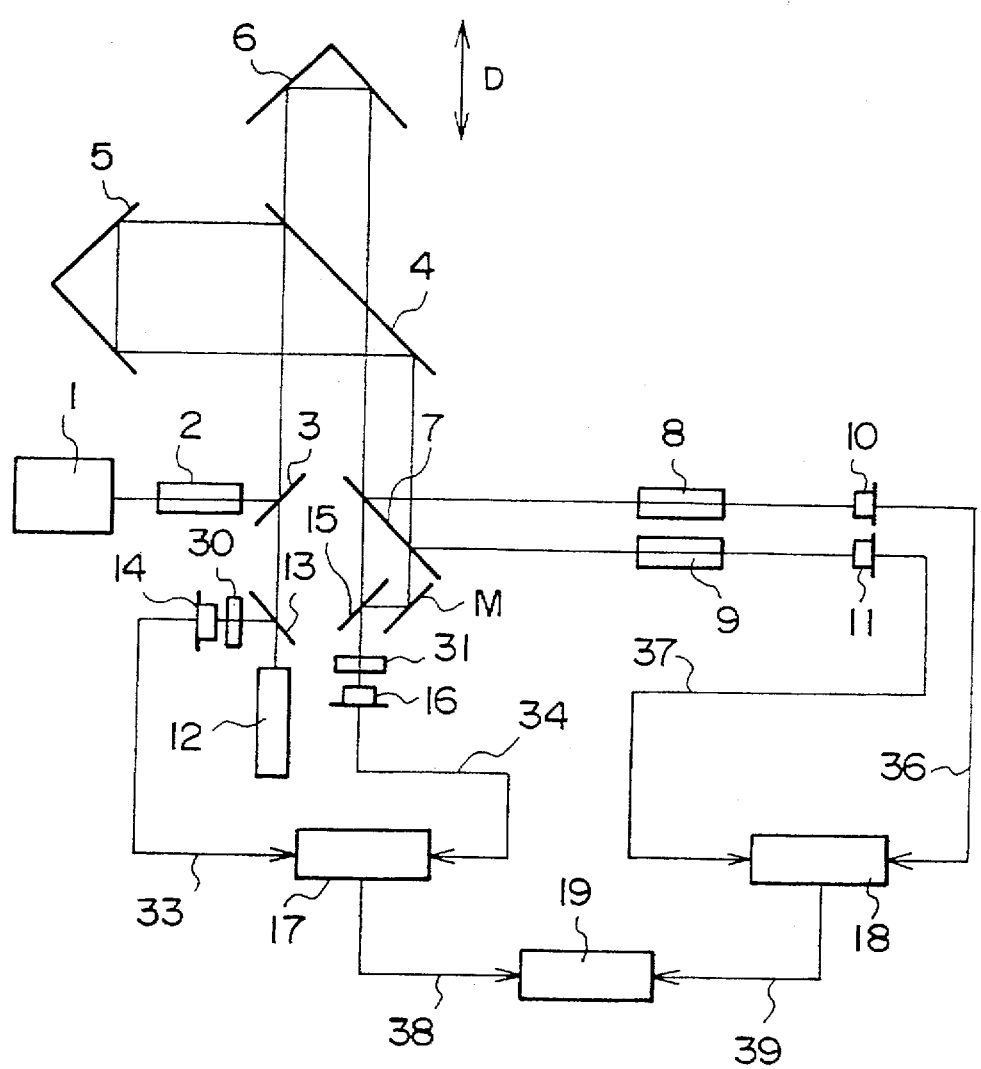
FIG. 4 is a view showing a schematic configuration of a first embodiment of the optical interference measuring apparatus in accordance with the present invention.

FIG. 4 is a view showing a schematic configuration of a first embodiment of the optical interference measuring apparatus in accordance with the present invention. In this first embodiment, so-called homodyne interferometry is used to measure the change of refractive index.

The optical interference measuring apparatus of FIG. 4 comprises a light source 1 for supplying light for measuring the change of refractive index. The light with a frequency $\omega_2$ emitted from the light source 1 enters an SHG device 2, thereby a part of the light with the frequency $\omega_2$ is converted by the SHG device 2 into a harmonic wave with a frequency $\omega_3$ while the rest is transmitted through the SHG device 2 as it is. The light with the frequency $\omega_2$ and the light with the frequency $\omega_3$ emitted from the SHG device 2 are reflected by a frequency coupling device 3 made of a dichroic mirror, for example, and then coupled with light (including a plurality of light components in the proximity of frequency $\omega_1$) from a length-measuring light source 12, which will be explained later, on an identical light path. Here, the frequency coupling device 3 has a characteristic such that only light in the proximity of frequency $\omega_1$ is transmitted therethrough while light with the other frequencies is reflected thereby.

The light with the frequency $\omega_2$ and light with the frequency $\omega_3$ reflected by the frequency coupling device 3 are made incident on a polarization separating device 4 such as a polarization beam splitter. The polarization beam splitter 4 is disposed with an inclination of 45° with respect to each of the polarization directions of the light with the frequency $\omega_2$ and light with the frequency $\omega_3$. Accordingly, the light incident on the polarization beam splitter 4 is divided into two light components, namely, reference light which is reflected by the polarization beam splitter 4 so as to be guided to a stationary mirror 5 and measurement light which is transmitted through the polarization beam splitter 4 so as to be guided to a movable mirror 6. Thus, the reference light and the measurement light have polarization directions orthogonal to each other while each include both light with the frequency $\omega_2$ and light with the frequency $\omega_3$. Here, the polarization direction of the light with the frequency $\omega_3$ subjected to SHG conversion by the SHG device 2 is different from that of the light with the frequency $\omega_3$ which enters the SHG device 2 and then is transmitted therethrough as it is. Accordingly, in the optical interference apparatus of FIG. 4, an optical system OP1 (composed of a plurality of wave plates) for adjusting the polarization directions of the light with the frequency $\omega_2$ and light with the frequency $\omega_3$ is disposed between the SHG device 2 and the frequency coupling device 3 such that the respective light components are incident on the polarization beam splitter 4 with predetermined polarization directions.

The reference light reflected by the polarization beam splitter 4 is reflected by the stationary mirror 5 and then returns to the polarization beam splitter 4. On the other hand, the measurement light transmitted through the polarization beam splitter 4 is reflected by the movable mirror 6 attached to the movable stage (cf. FIGS. 2 and 3) and then returns to the polarization beam splitter 4. At this time, a light path separating mechanism of the optical interference measuring mechanism places the stationary mirror 5, which is a reference reflector, and the movable mirror 6, which is a measurement reflector, at positions where the incident points of the reference light and measurement light re-entering the polarization beam splitter 4 do not substantially overlap each other.

Figure 5:
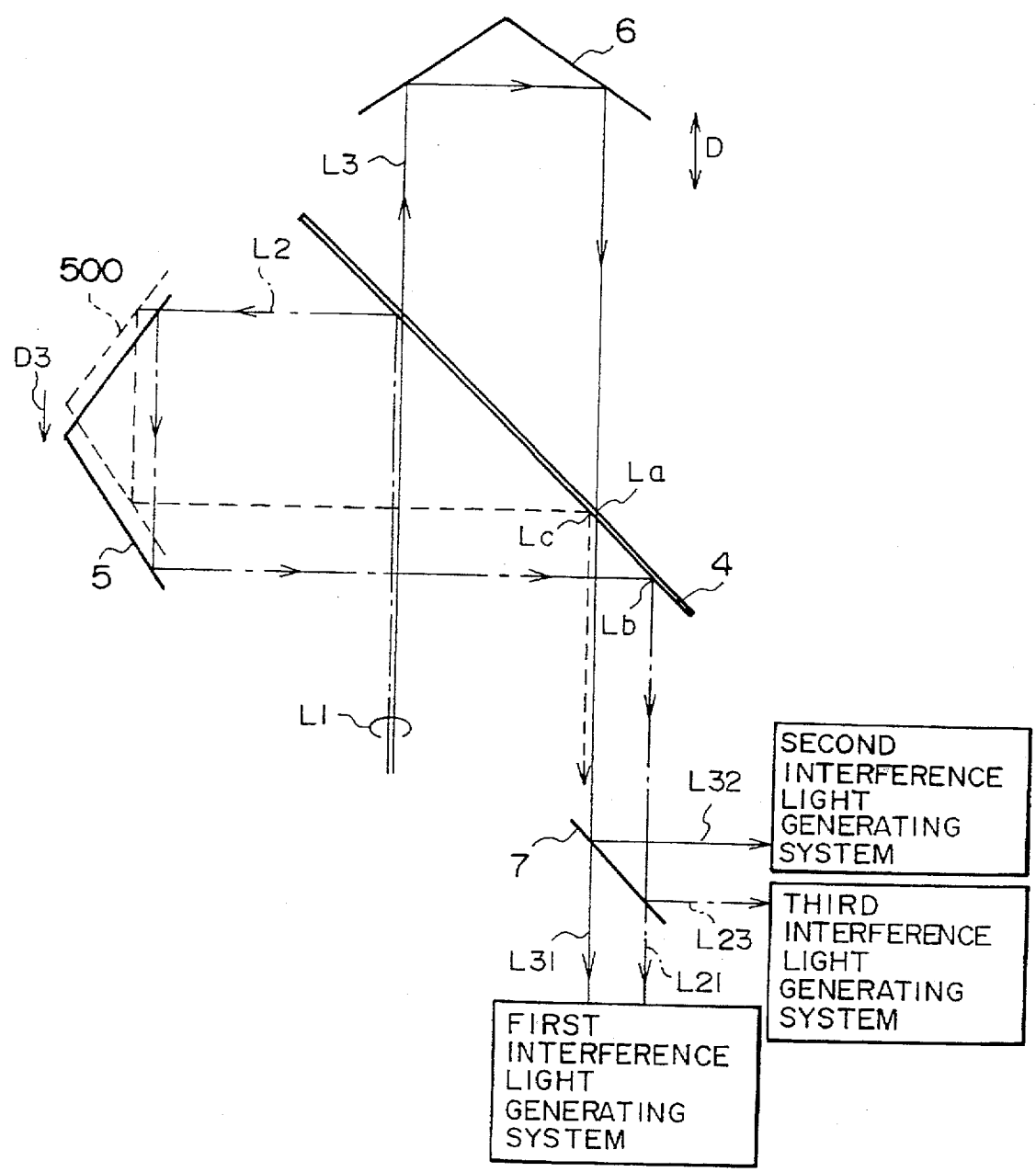
FIG. 5 is a view for explaining a basic configuration of a light path separating mechanism in an optical interference measuring apparatus in accordance with the present invention.

Specifically, as shown in FIG. 5, by the light path separating mechanism, the stationary mirror 5 and the movable mirror 6 are placed at positions where an incident position La, at which the reference light reflected by the movable mirror 6 is incident on the polarization beam splitter 4 and an incident position Lb, at which the measurement light reflected by the stationary mirror 5 is incident on the polarization beam splitter 4, can be prevented from substantially overlapping each other. Here, that the incident positions do not substantially overlap each other is equivalent to measurement light L3, emitted from the polarization beam splitter 4 after having propagated through the measurement light path, and reference light L2, emitted from the polarization beam splitter 4 after having propagated through the reference light path, do not propagate through an identical light path. Accordingly, this light path separating mechanism places the stationary mirror 5 at a position which is shifted, by a predetermined distance in a direction indicated by arrow D3 (direction in parallel to the measurement light path) in FIG. 5, for example, from a position (position indicated by dashed line in the drawing where a reference reflector 500 is disposed) at which the reference light is incident at a position Lc which substantially overlaps the incident position La of the measurement light L3.

According to the foregoing configuration, in the optical interference measuring apparatus in accordance with the present invention, the reference light containing at least the second reference light component (frequency $\omega_2$) and third reference light component (frequency $\omega_3$) and the measurement light containing at least the second measurement light component (frequency $\omega_2$) and third measurement light component (frequency $\omega_3$) are independent from each other without overlapping each other. As a result, crosstalk between the reference light and the measurement light for correcting the influence due to the change of refractive index in the measurement light path and reference light path is substantially prevented from occurring, thereby enabling highly accurate measurement.

Thus, the light with the frequency $\omega_2$ and light with the frequency $\omega_3$ emitted from the polarization beam splitter 4 by way of the reference light path and the light with the frequency $\omega_2$ and light with the frequency $\omega_3$ emitted from the polarization beam splitter 4 by way of the measurement light path are made incident on a frequency separating device 7 (first frequency separator included in a frequency separating system) in light paths different from each other (spatially separated from each other). Like the frequency coupling device 3, the frequency separating device 7 is constituted by a dichroic mirror, for example, and has a characteristic such that only light in the proximity of $\omega_1$ is transmitted therethrough while light with the frequency $\omega_2$ and light with the frequency $\omega_3$ are reflected thereby. Accordingly, due to the operation of the frequency separating device 7, the light with the frequency $\omega_2$ and the light with the frequency $\omega_3$ are separated from light (light in the proximity of $\omega_1$) from the length-measuring light source 12 which will be explained later.

The light with the frequency $\omega_2$ and light with frequency $\omega_3$ reflected by the frequency separating device 7, namely, the light with the frequency $\omega_2$ and light with the frequency $\omega_3$ propagated through the reference light path, are made incident on an SHG device 9, whereas the light with the frequency $\omega_2$ and light with the frequency $\omega_3$ propagated through the measurement light path are made incident on an SHG device 8 along a light path different from (spatially separated from) that of the light incident on the SHG device 9. Each of the SHG devices 8 and 9 converts the light with the frequency $\omega_2$ (light having a lower frequency) into light with the frequency $\omega_3$ ($=2\omega_2$) by SHG conversion, while transmitting the light with the frequency $\omega_3$ (light having a higher frequency) therethrough as it is.

Thus (in second and third interference light generating systems), the light with the frequency $\omega_3$ subjected to SHG conversion by the SHG device 8 or 9 interferes with the light with the frequency $\omega_3$ converted by the SHG converting device 2 (the light with the frequency $\omega_3$ transmitted through the SHG converting devices 8 or 9 as it is). The respective interference light components (second interference light and third interference light) are received by photoelectric converters 10 and 11. Here, the polarization direction of the light with the frequency $\omega_3$ subjected to SHG conversion by the SHG device 8 or 9 differs from that of the light with the frequency $\omega_3$ which is subjected to SHG conversion by the SHG device 2 and then enters the SHG device 8 or 9 as it is. Accordingly, in order to make the polarization direction of the light with the frequency $\omega_3$, subjected to SHG conversion by the SHG device 8 or 9, and that of the light with the frequency $\omega_3$, transmitted through the SHG device 8 or 9 as it is, interfere with each other, their polarization directions have to be made to coincide with each other. Therefore, in the optical interference measuring apparatus of FIG. 4, in front of the SHG devices 8 and 9, optical systems OP2 and OP3 (each composed of a plurality of wave plates) for adjusting the polarization directions of the two light components have to be disposed, respectively. Actually, it is preferable that the predetermined adjustment optical systems OP2 and OP3 be respectively disposed in front of the SHG devices 8 and 9 (on the side of the frequency separating device 7) such that the light with the frequency $\omega_2$ can be incident on the SHG converting devices 8 and 9 with a polarization direction by which its converting efficiency is maximized. Thus, due to the predetermined adjustment optical system OP2 or OP3, disposed in front of the SHG converting device 8 or 9, the polarization direction of light whose frequency has changed from $\omega_2$ to $\omega_3$ upon SHG conversion by the SHG device 8 or 9 coincides with that of the light with the frequency $\omega_3$ which has been subjected to SHG conversion by the SHG device 2 and then transmitted through the SHG device 8 or 9 as it is.

In the photoelectric converter 11, an interference signal 37 is generated by the light with the frequency $\omega_2$ and light with the frequency $\omega_3$ which have passed through the reference light path. In the photoelectric converter 10, on the other hand, an interference signal 36 is generated by the light with the frequency $\omega_2$ and light with the frequency $\omega_3$ which have passed through the measurement light path. Both interference signal 37 from the photoelectric converter 11 and interference signal 36 from the photoelectric converter 10 are supplied to a phase meter 18. Based on the phase difference between the interference signal 37 generated by the light with the frequency $\omega_2$ and light with the frequency $\omega_3$ which have passed through the reference light path and the interference signal 36 generated by the light with the frequency $\omega_2$ and light with the frequency $\omega_3$ which have passed through the measurement light path, the phase meter 18 detects $(D(\omega_3)-D(\omega_2))$ which is the difference between light path length change $D(\omega_3)$ with respect to the light with the frequency $\omega_3$ and light path length change $D(\omega_2)$ with respect to the light with the frequency $\omega_2$. A signal 39 concerning $(D(\omega_3)-D(\omega_2))$ determined by the phase meter 18 is supplied to a calculator 19.

The optical interference measuring apparatus of FIG. 4 also comprises the length-measuring light source 12 which supplies light for measuring the displacement of the movable mirror 6 in the direction of an optical axis (direction of arrow in the drawing). The length-measuring light source 12 emits two light components which have frequencies slightly different from each other and whose polarization directions are orthogonal to each other, namely, light (first light) with a frequency $\omega_1$ and light with a frequency $\omega_{1a}(\omega_{1a}=\omega_1+\Delta\omega_1)$, along an identical light path. Most of these two orthogonal frequency light components are transmitted through a beam splitter 13 and then enter the frequency coupling device 3.

The two frequency light components transmitted through the frequency coupling device 3 are made incident on the polarization beam splitter 4. The polarization beam splitter 4 is disposed such that light having a polarization direction identical to that of the light with the frequency $\omega_{1a}$ is reflected thereby while light having a polarization direction identical to that of the light with the frequency $\omega_1$ is transmitted therethrough. Accordingly, of the two frequency light components incident on the polarization beam splitter 4, the light with the frequency $\omega_{1a}$ is reflected by the polarization beam splitter 4 so as to be guided, as a first reference light component, to the stationary mirror 5 made of a corner-cube prism. On the other hand, of the two frequency light components, the light with the frequency $\omega_1$ is transmitted through the polarization beam splitter 4 so as to be guided, as a first measurement light component, to the movable mirror 6 made of a corner-cube prism.

The first reference light component is reflected by the stationary mirror 5 and then returns to the polarization beam splitter 4. Also, the first measurement light component transmitted through the polarization beam splitter 4 is reflected by the movable mirror 6 and then returns to the polarization beam splitter 4. Thus, the reference light component with the frequency $\omega_{1a}$ returns to the polarization beam splitter 4 along the light path identical to that of the reference light component including the light with frequency $\omega_2$ (second reference light component) and the light with frequency $\omega_3$ (third reference light component). Similarly, the measurement light component with the frequency $\omega_1$ returns to the polarization beam splitter 4 along the light path identical to that of the measurement light component including the light with frequency $\omega_2$ (second measurement light component) and the light with frequency $\omega_3$ (third measurement light component). Namely, the incident points of the reference light and measurement light re-entering the polarization beam splitter 4 are configured so as to be prevented from overlapping each other (cf. FIG. 5 mentioned above).

Thus, the light with the frequency $\omega_{1a}$ emitted from the polarization beam splitter 4, after having propagated through the reference light path, and the light with the frequency $\omega_1$, emitted from the polarization beam splitter 4 after having propagated through the measurement light path, are made incident on the frequency separating device 7 along light paths different from each other (light paths spatially separated from each other). As mentioned above, the frequency separating device 7 has a characteristic such that only the light components in the proximity of frequency $\omega_1$ are transmitted therethrough while the light components with the other frequencies $\omega_2$ and $\omega_3$ are reflected thereby. Accordingly, the reference light component with the frequency $\omega_{1a}$ and the measurement light component with the frequency $\omega_1$ are transmitted through the frequency separating device 7. The reference light component with the frequency $\omega_{1a}$ transmitted through the frequency separating device 7 is reflected by a mirror M and then made incident on a polarization beam splitter 15, while the measurement light component with the frequency $\omega_1$ transmitted through the frequency separating device 7 is incident on the polarization beam splitter 15 as it is.

The reference light component with the frequency $\omega_{1a}$ and the measurement light component with the frequency $\omega_1$ coupled together on the identical light path by way of the polarization beam splitter 15 interfere with each other by way of a polarizing device 31 (first interference light generating system). Here, the polarizing device 31 is constituted by a polarizer which is disposed with an inclination of 45° with respect to each of the polarization directions of the two frequency light components, for example. The interference light (first interference light) generated by way of the polarizing device 31 is received by a photoelectric converter 16, which then supplies a measurement beat signal (frequency $\Delta\omega_1$) 34 to a phase meter 17.

On the other hand, a part of the two frequency light components emitted from the length-measuring light source 12, namely, a part of the light with the frequency $\omega_{1a}$ and light with the frequency $\omega_1$, is reflected by the beam splitter 13 and then enters a polarizing device 30. Here, like the polarizing device 31, the polarizing device 30 is a polarizer for making two frequency light components interfere with each other. Accordingly, the interference light generated by the light with the frequency $\omega_{1a}$ and light with the frequency $\omega_1$ by way of the polarizing device 30 is detected by a photoelectric converter 14. The photoelectric converter 14 supplies a reference beat signal (frequency $\Delta\omega_1$) 33 based on the interference light generated by the light with the frequency $\omega_{1a}$ and light with the frequency $\omega_1$ to the phase meter 17.

The phase meter 17 measures a change in phase of the measurement beat signal 34 with respect to the reference beat signal 33 so as to determine a displacement $D(\omega_1)$ of the movable mirror 6 without consideration of the change of refractive index and supplies a signal concerning this displacement $D(\omega_1)$ to the calculator 19. When the signal 38 from the phase meter 17 and the signal 39 from the phase meter 18 are input, the calculator 19 determines and outputs, on the basis of the operation expression indicated by the above-mentioned equation (4), the true displacement D of the movable mirror 6 in which the length-measuring error due to the change of refractive index has been corrected and, accordingly, the true displacement D of the movable stage (FIGS. 2 and 3).

As explained in the foregoing, in this first embodiment, the reference light reflected by the stationary mirror 5 and the measurement light reflected by the movable mirror 6 are received along the light paths different from each other. Namely, the measurement light component containing at least the light with the frequency $\omega_2$ and light with the frequency $\omega_3$, and the reference light component containing at least the light with the frequency $\omega_2$ and light with the frequency $\omega_3$ are detected independently without overlapping each other. As a result, crosstalk between the reference light and the measurement light for correcting the change of refractive index can be substantially prevented from occurring, thereby enabling highly accurate measurement.

Here, though the amount of change of refractive index in the measurement light path can be measured, the direction of the change of refractive index cannot be judged in the optical interference measuring apparatus. Namely, it cannot judge whether the phase of the signal 36 from the photoelectric converter 10 is advanced or retarded with respect to that of the signal 37 from the photoelectric converter 11. Accordingly, in order to judge the change of refractive index, it is necessary to obtain signals whose phases are shifted by 90° with respect to the interference signals 36 and 37 detected at the photoelectric converters 10 and 11 in FIG. 4, respectively. Methods therefor are generally well-known. For example, the interference light incident on the photoelectric converter 10 may be divided into two interference light components, which are then detected such that, with respect to one of thus divided interference light components, the phase of the other interference light component is shifted by 90°, thereby the direction of change of refractive index may be judged from the two signals obtained from these two interference light components. Here, in order to shift, with respect to one interference light, the phase of the other interference light by 90°, a wave plate, a polarizing device, or the like is used. Also, when the light path length of one of the frequency light component in two frequency light components incident on the SHG device 8 is modulated with a predetermined frequency f and then synchronous detection based on the predetermined frequency f is performed, two signals whose phases are shifted by 90° with respect to each other can be obtained, thereby the direction of the change of refractive index can be judged. Further, with respect to the interference signal 37 detected by the photoelectric converter 11, the direction of the change of refractive index can be judged similarly.

Figure 6:
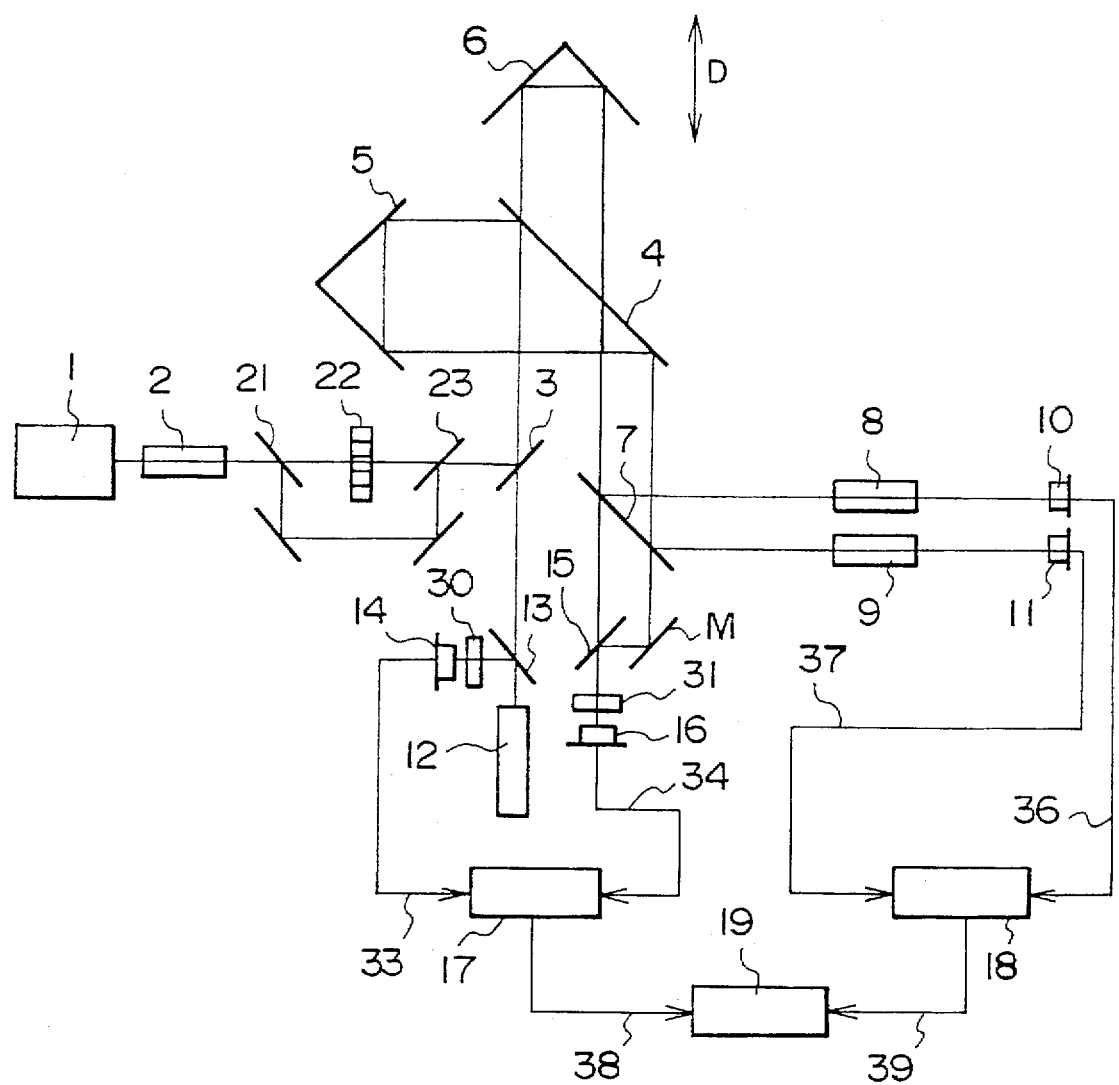
FIG. 6 is a view showing a schematic configuration of a second embodiment of the optical interference measuring apparatus in accordance with the present invention.

FIG. 6 shows a schematic configuration of the second embodiment of the optical interference measuring apparatus in accordance with the present invention. In this second embodiment, so-called heterodyne interferometry is used for measuring the change of refractive index.

In the optical interference measuring apparatus of FIG. 6, in order to detect, according to heterodyne interferometry, interference light generated from the light with the frequency $\omega_2$ and light with the frequency $\omega_3$, frequency filters 21 and 23 and a frequency shifter 22 are disposed between the SHG device 2 and the frequency coupling device 3. Except for this point, however, the configuration of the apparatus in FIG. 6 is basically identical to that of the first embodiment (FIG. 4). Accordingly, in FIG. 6, the constituents having functions similar to those of the first embodiment are referred to with marks identical to those in FIG. 4. In the following, the second embodiment will be explained in consideration of its difference from the first embodiment.

The light with the frequency $\omega_2$ and light with the frequency $\omega_3$ emitted from the SHG device 2 enter the frequency filter 21. Each of the frequency filters 21 and 23 has a characteristic such that the light in the proximity of frequency $\omega_3$ is transmitted therethrough whereas the light with the frequency $\omega_2$ is reflected thereby. The light with the frequency $\omega_3$ transmitted thorough the frequency filter 21 becomes, by way of the frequency shifter 22, light with a frequency $\omega_{3a}$ ($\omega_{3a}=\omega_3+\Delta\omega_3$) which is slightly shifted from the frequency $\omega_3$. Here, the frequency shifter 22 is an acousto-optic device, for example. The light with the frequency $\omega_{3a}$ generated by way of the phase shifter 22 enters the frequency filter 23.

On the other hand, the light with the frequency $\omega_2$ reflected by the frequency filter 21 is made incident on the frequency filter 23 by way of two reflective mirrors. Thus, the light with the frequency $\omega_{3a}$ and the light with the frequency $\omega_2$ are coupled together on an identical light path again by the frequency filter 23. Thereafter, the light with the frequency $\omega_2$ and the light with the frequency $\omega_{3a}$ travel through the light paths similar to those of the light with the frequency $\omega_2$ and the light with the frequency $\omega_3$ in the first embodiment and then are reflected by the frequency separating device 7 as a measurement light component and a reference light component.

Of the measurement light component with the frequency $\omega_2$ and the measurement light component with the frequency $\omega_{3a}$, the former is converted into light with the frequency $\omega_3$ by the SHG device 8, whereas the latter, generated by way of the frequency shifter 22, is transmitted through the SHG device 8 as it is. Thus, unlike the first embodiment, two light components whose frequencies differ from each other by $\Delta\omega_3$, namely, the light with the frequency $\omega_3$ (second harmonic wave of the measurement light with the frequency $\omega_2$) and the measurement light component with the frequency $\omega_{3a}$ interfere with each other in a heterodyne interferometry. Similarly, by way of the SHG device 9, the reference light component with the frequency $\omega_2$ and the reference light component with the frequency $\omega_{3a}$ interfere with each other in a heterodyne interferometry.

Accordingly, both of the reference signal 37 from the photoelectric converter 11 and the measurement signal 36 from the photoelectric converter 10 become interference beat signals. As in the case of the first embodiment, the phase meter 18 determines ($D(\omega_{3a})-D(\omega_2)$) and supplies the signal 39 concerning this value to the calculator 19.

The calculator 19 receives the signal 38 from the phase meter 17 and the signal 39 from the phase meter 18 and, based on the above-mentioned equation (4), determines the true displacement D in which the length-measuring error due to the change of refractive index has been corrected.

Thus, also in the second embodiment, crosstalk between the reference light and the measurement light for correcting the change of refractive index can be substantially prevented from occurring, thereby enabling highly accurate measurement.

Also, in the second embodiment, the measurement of change of refractive index by means of the light with the frequency $\omega_2$ and the light with the frequency $\omega_3$ is effected by heterodyne interferometry. Accordingly, it is unlikely to be subjected to an error caused by change of refractive index in output of the light source 1, thereby the phase difference ($D(\omega_{3a})-D(\omega_2)$) can be detected correctly. As a result, accuracy in detection of the true displacement D can be improved.

Further, when not only the light with the frequency $\omega_3$ but also the light with the frequency $\omega_2$ is subjected to frequency modulation, the detection error due to the light returning to the light source can be reduced.

In the first and second embodiments, as a light path separating means for separating light paths such that the reference light component and the measurement light component for correcting the change of refractive index are not coupled together on the same light path, the stationary mirror and movable mirror each composed of a corner-cube prism are used. In place of the corner-cube prism, however, a cat's-eye or the like may be used alternatively.

Figure 7:
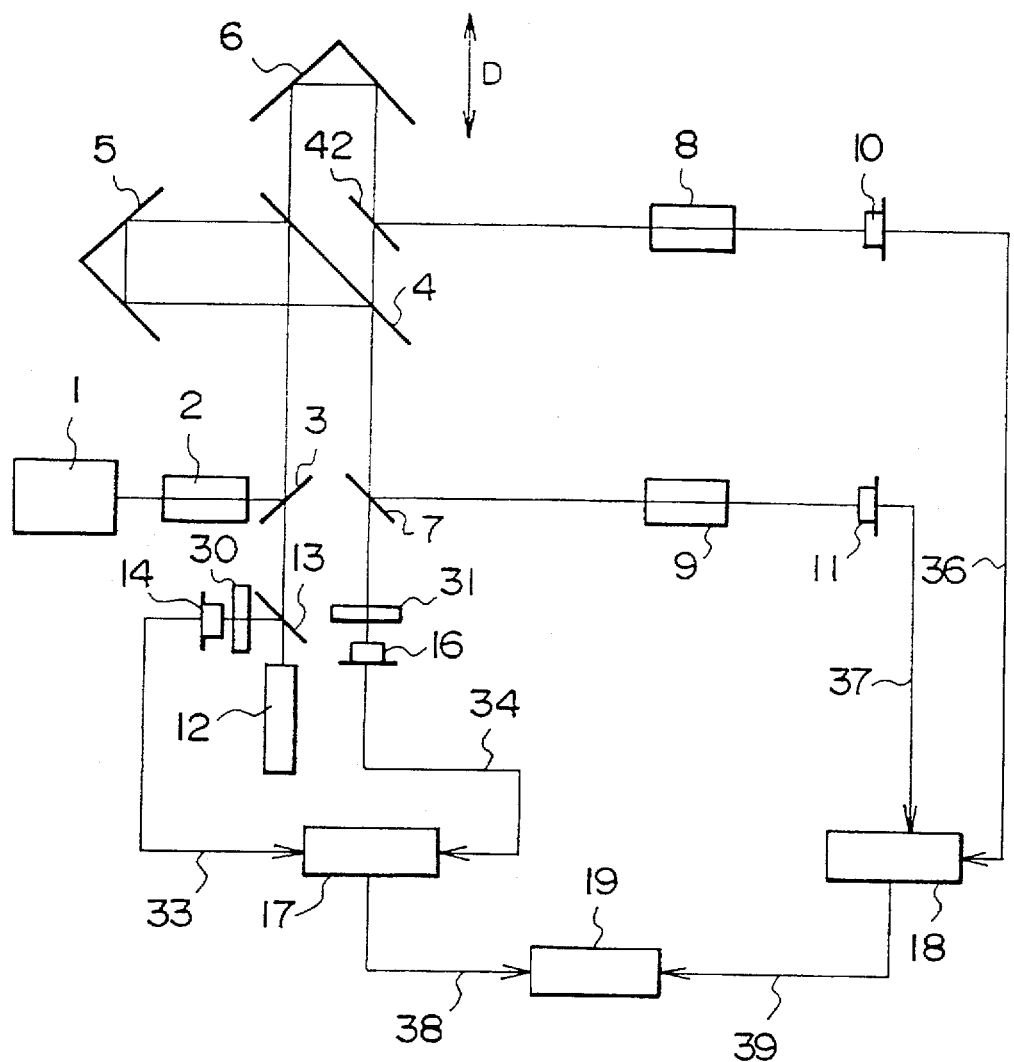
FIG. 7 is a view showing a schematic configuration of a third embodiment of the optical interference measuring apparatus in accordance with the present invention.

FIG. 7 is a view showing a schematic configuration of the third embodiment of the optical interference measuring apparatus in accordance with the present invention.

In this third embodiment, as a light path separating mechanism for separating light paths such that the reference light component and measurement light component for correcting the change of refractive index are not coupled together on the same light path, a frequency separating device 42 (second frequency separator in the frequency separating system) is disposed between the movable mirror 6 and the polarization separating device 4. Except for this point, however, the configuration of the apparatus in FIG. 7 is basically identical to that of the first embodiment (FIG. 4). Accordingly, in FIG. 7, the constituents having functions similar to those of the first embodiment are referred to with marks identical to those in FIG. 4. In the following, the third embodiment will be explained in consideration of its difference from the first embodiment.

According to the configuration of the third embodiment, without the reference light reflected by the stationary mirror 5 and the measurement light reflected by the movable mirror 6 being coupled together on the same light path, the correcting reference light component in the reference light and the correcting measurement light component in the measurement light are made incident on the SHG device 9 and the SHG device 8 by way of the frequency separating device 7 and the frequency separating device 42, respectively. Namely, also in the third embodiment, crosstalk between the reference light and the measurement light for correcting the change of refractive index can be substantially prevented from occurring, thereby enabling highly accurate measurement.

In the third embodiment, the frequency separating device 42 is disposed between the movable mirror 6 and the polarization separating device 4. However, what matters is to detect the measurement light component including light with the frequency $\omega_2$ and light with the frequency $\omega_3$ and the reference light component including light with the frequency $\omega_2$ and light with the frequency $\omega_3$ independently without overlapping them on the same light path. Accordingly, a frequency separating device may be disposed in a light path between the stationary mirror 5 and the polarization separating device 4. Alternatively, frequency separating devices may be respectively disposed in the light path between the movable mirror 6 and the polarization separating device 4 and the light path between the stationary mirror 5 and the polarization separating device 4.

In the above-mentioned first to third embodiments, the length-measuring error due to the change of refractive index in the light path can be corrected while crosstalk between the reference light and measurement light are prevented from occurring. However, each of the first to third embodiments has a so-called single-path configuration in which the reference light and the measurement light respectively reciprocate through the reference light path and the measurement light path only once.

In the following, embodiments of the optical interference measuring apparatus having a double-path construction in order to measure the displacement of a movable stage (wafer stage, or the like) with a higher accuracy will be explained.

Figure 8:
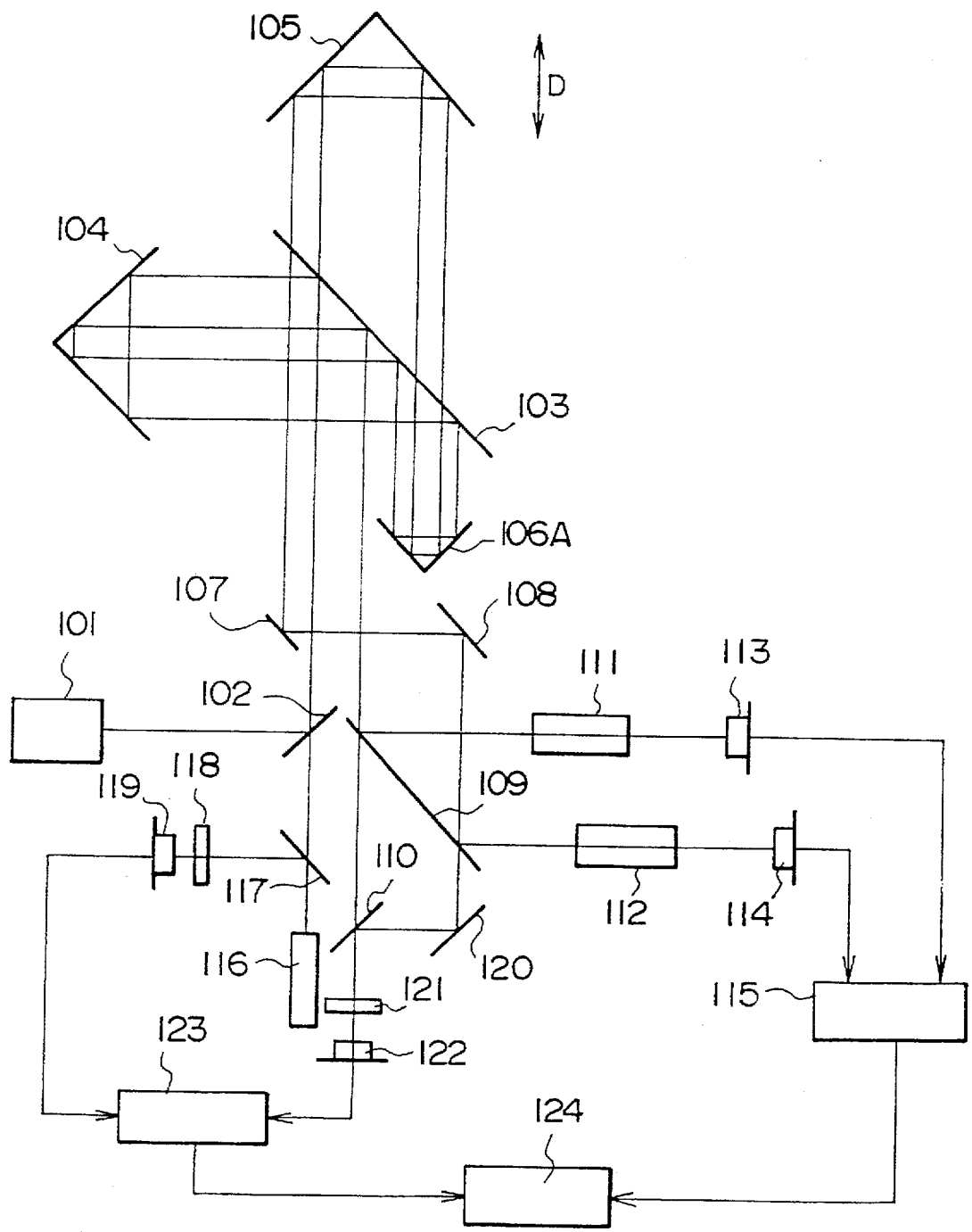
FIG. 8 is a view showing a schematic configuration of a fourth embodiment of the optical interference measuring apparatus in accordance with the present invention.

FIG. 8 is a view showing a schematic configuration of the fourth embodiment of the optical interference measuring apparatus in accordance with the present invention. This fourth embodiment uses homodyne interferometry of so-called double-path construction to measure the change of refractive index.

The optical interference measuring apparatus of FIG. 8 comprises a light source 101 for supplying light for measuring the change of refractive index. The light source 101 emits light with a frequency $\omega_2$ and light with a frequency $\omega_3$ ($\omega_3=2\omega_2$) along an identical light path. Here, the light source 101 contains, for example, an SHG device therein. Then, in the light source 101, a part of the light with the frequency $\omega_2$ is converted by the SHG device into SHG light with the frequency $\omega_3$ while the rest of the light with the frequency $\omega_2$ is transmitted therethrough as it is.

The light with the frequency $\omega_2$ and the light with the frequency $\omega_3$ emitted from the light source 101 are reflected by a frequency coupling device 102 made of a dichroic mirror, for example, and then coupled with light (light in the proximity of frequency $\omega_1$) from a length-measuring light source 116, which will be explained later, on an identical light path. Here, the frequency coupling device 102 has a characteristic such that only light in the proximity of frequency $\omega_1$ is transmitted therethrough while light with the other frequencies is reflected thereby.

The light with the frequency $\omega_2$ and the light with the frequency $\omega_3$ reflected by the frequency coupling device 102 are made incident on a polarization separating device 103 (main polarization separator) such as a polarization beam splitter. The polarization beam splitter 103 is disposed with an inclination of 45° with respect to each of the polarization directions of the light with the frequency $\omega_2$ and light with the frequency $\omega_3$. Accordingly, the light incident on the polarization beam splitter 103 is divided into two light components, namely, reference light which is reflected by the polarization beam splitter 103 so as to be guided to a stationary mirror 104 (reference reflector) and measurement light which is transmitted through the polarization beam splitter 103 so as to be guided to a movable mirror 105 (measurement reflector). Thus, the reference light and the measurement light have polarization directions orthogonal to each other while each include both light with the frequency $\omega_2$ and light with the frequency $\omega_3$.

The reference light reflected by the polarization beam splitter 103 is reflected by the stationary mirror 104 and then returns to the polarization beam splitter 103 along a first reference light path. The reference light reflected by the beam splitter 103 is reflected by a corner-cube prism 106A (first relay reflector) and then enters the polarization beam splitter 103. The reference light reflected by the polarization beam splitter 103 is reflected by the stationary mirror 104 again and then returns to the polarization beam splitter 103 along a second reference light path which is different from the first reference light path. Thus, after reciprocating through the reference light path to the stationary mirror 104 twice, the reference light returns to the polarization beam splitter 103.

On the other hand, the measurement light transmitted through the polarization beam splitter 103 is reflected by the movable mirror 105 attached to the movable stage (cf. FIGS. 2 and 3) and then returns to the polarization beam splitter 103 along a first measurement light path. The measurement light transmitted through the polarization beam splitter 103 is reflected by the corner-cube prism 106A along a light path, which is different from that of the reference light, and then enters the polarization beam splitter 103. The measurement light transmitted through the polarization beam splitter 103 is reflected by the movable mirror 105 again and then returns to the polarization beam splitter 103 along a second measurement light path which is different from the first measurement light path. Thus, after reciprocating through the measurement light path to the movable mirror 105 twice, the measurement light returns to the polarization beam splitter 103. In this embodiment, the corner-cube prisms 106A and 103 define a relay optical system.

At this time, a light path separating mechanism of the optical interference measuring mechanism is placed (such as arranging the stationary mirror 104, which is a reference reflector, the movable mirror 105, which is a measurement reflector, and the corner-cube prism 106A at their respective positions) where the incident point of the reference light entering the polarization beam splitter 103 by way of the second reference light path and the incident point of the measurement light entering the polarization beam splitter 103 by way of the second measurement light path do not substantially overlap each other.

Thus, the light with the frequency $\omega_2$ and light with the frequency $\omega_3$, emitted from the polarization beam splitter 103 by way of the reference light path, and the light with the frequency $\omega_2$ and light with the frequency $\omega_3$, emitted from the polarization beam splitter 103 by way of the measurement light path, enter a frequency separating device 109 (first frequency separator in the frequency separating system) along light paths different from each other. More specifically, the measurement light enters the frequency separating device 109 by way of reflective mirrors 107 and 108, whereas the reference light directly enters the frequency separating device 109. Like the frequency coupling device 102, the frequency separating device 109 is constituted by a dichroic mirror, for example, and has a characteristic such that only light in the proximity of $\omega_1$ is transmitted therethrough while light with the other frequencies is reflected thereby. Accordingly, by the frequency separating device 109, the light with the frequency $\omega_2$ and the light with the frequency $\omega_3$ are separated from the light (light in the proximity of $\omega_1$) from the length-measuring light source 116 which will be explained later.

The light with the frequency $\omega_2$ and light with frequency $\omega_3$ reflected by the frequency separating device 109, namely, the reference light component with the frequency $\omega_2$ and reference light component with frequency $\omega_3$ and the measurement light component with the frequency $\omega_2$ and measurement light component with the frequency $\omega_3$, are made incident on SHG devices 111 and 112, respectively, along light paths different from each other. For example, KTiOPO$_4$ crystal may be used for the SHG devices 111 and 112. Thus, each of the SHG devices 111 and 112 converts the light with the frequency $\omega_2$ (light having a lower frequency) into light with the frequency $\omega_3$ (=2$\omega_2$) by SHG conversion, while transmitting the light with the frequency $\omega_3$ (light having a higher frequency) therethrough as it is.

Thus (in second and third interference light generating systems), the light with the frequency $\omega_3$ subjected to SHG conversion by the SHG devices 111 or 112 interferes with the light with the frequency $\omega_3$ from the light source 101 (the light with the frequency $\omega_3$ transmitted through the SHG converting devices 111 or 112 as it is). The respective interference light components (second interference light and third interference light) are received by photoelectric converters 113 and 114.

The photoelectric converter 113 detects an interference signal generated by the reference light component with the frequency $\omega_2$ and the reference light component with the frequency $\omega_3$. The photoelectric converter 114, on the other hand, detects an interference signal generated by the measurement light component with the frequency $\omega_2$ and the measurement light component with the frequency $\omega_3$. Both the interference signal from the photoelectric converter 113 and the interference signal from the photoelectric converter 114 are supplied to a phase meter 115.

Based on the phase difference between the interference signal generated by the reference light component with the frequency $\omega_2$ and reference light component with the frequency $\omega_3$ and the interference signal generated by the measurement light component with the frequency $\omega_2$ and measurement light component with the frequency $\omega_3$, the phase meter 115 detects (D($\omega_3$)–D($\omega_2$)). A signal concerning (D($\omega_3$)–D($\omega_2$)) determined by the phase meter 115 is supplied to a calculator 124.

The optical interference measuring apparatus of FIG. 8 also comprises the length-measuring light source 116 which supplies light for measuring the amount of displacement of the movable mirror 105 in the direction of an optical axis D (direction of arrow in the drawing). The length-measuring light source 116 emits two light components which have frequencies slightly different from each other and whose polarization directions are orthogonal to each other, namely, light (first light) with a frequency $\omega_1$ and light with a frequency $\omega_{1a}$ ($\omega_{1a}=\omega_1+\Delta\omega_1$), along an identical light path. Most of these two orthogonal frequency light components are transmitted through a beam splitter 117 and then made incident on the frequency coupling device 102.

The two frequency light components transmitted through the frequency coupling device 102 are made incident on the polarization beam splitter 103. The polarization beam splitter 103 is disposed such that light having a polarization direction identical to that of the light with the frequency $\omega_{1a}$ is reflected thereby while light having a polarization direction identical to that of the light with the frequency $\omega_1$ is transmitted therethrough. Accordingly, of the two frequency light components incident on the polarization beam splitter 103, the light with the frequency $\omega_{1a}$ is reflected by the polarization beam splitter 103 so as to be guided, as a first reference light component, to the stationary mirror 104. On the other hand, of the two frequency light components, the light with the frequency $\omega_1$ is transmitted through the polarization beam splitter 103 so as to be guided, as a first measurement light component, to the movable mirror 105.

The first reference light component reflected by the polarization beam splitter 103 returns to the polarization beam splitter 103 successively by way of the stationary mirror 104, the polarization beam splitter 103, the corner-cube prism 106A, the polarization beam splitter 103, and the stationary mirror 104. Also, the first measurement light component transmitted through the polarization beam splitter 103 returns to the polarization beam splitter 103 successively by way of the movable mirror 105, the polarization beam splitter 103, the corner-cube prism 106A, the polarization beam splitter 103, and the movable mirror 105.

Thus, the first reference light component with the frequency $\omega_{1a}$ returns to the polarization beam splitter 103 along the light path identical to that of the reference light component including the light with frequency $\omega_2$ (second reference light component) and the light with frequency $\omega_3$ (third reference light component). Similarly, the first measurement light component with the frequency $\omega_1$ returns to the polarization beam splitter 103 along the light path identical to that of the measurement light component including the light with frequency $\omega_2$ (second measurement light component) and the light with frequency $\omega_3$ (third measurement light component). Namely, the configuration is such that the reference light component with the frequency $\omega_{1a}$ and the measurement light component with the frequency $\omega_1$ return to the polarization beam splitter 103 after respectively reciprocating twice along the reference light path and the measurement light path which do not overlap each other.

Thus, the first reference light component with the frequency $\omega_{1a}$ emitted from the polarization beam splitter 103 and the first measurement light component with the frequency $\omega_1$ emitted from the polarization beam splitter 103 are made incident on the frequency separating device 109 along light paths different from each other. As mentioned above, the frequency separating device 109 has a characteristic such that only the light components in the proximity of frequency $\omega_1$ are transmitted therethrough while the light components with the other frequencies are reflected thereby. Accordingly, the first reference light component with the frequency $\omega_{1a}$ and the first measurement light component with the frequency $\omega_1$ are transmitted through the frequency separating device 109. The first measurement light component with the frequency $\omega_1$ transmitted through the frequency separating device 109 is reflected by a reflective mirror 120 and then made incident on a polarization beam splitter 110, while the first reference light component with the frequency $\omega_{1a}$ transmitted through the frequency separating device 109 is incident on the polarization beam splitter 110 as it is.

The first reference light component with the frequency $\omega_{1a}$ and the first measurement light component with the frequency $\omega_1$ coupled together on the identical light path by way of the polarization beam splitter 110 interfere with each other by way of a polarizing device 121 (first interference light generating system). Here, the polarizing device 121 is constituted by a polarizer which is disposed with an inclination of 45° with respect to each of the polarization directions of the two frequency light components, for example. The interference light (first interference light) generated by way of the polarizing device 121 is received by a photoelectric converter 122, which then supplies a measurement beat signal (frequency $\Delta\omega_1$) based on this interference light to a phase meter 123.

On the other hand, a part of the two frequency light components emitted from the length-measuring light source 116, namely, a part of the light with the frequency $\omega_{1a}$ and light with the frequency $\omega_1$, is reflected by the beam splitter 117 and then enters a polarizing device 118. Here, like the polarizing device 121, the polarizing device 118 is a polarizer for making two frequency light components interfere with each other. Accordingly, the interference light generated by the light with the frequency $\omega_{1a}$ and light with the frequency $\omega_1$ by way of the polarizing device 118 is detected by a photoelectric converter 119. The photoelectric converter 119 supplies a reference beat signal (frequency $\Delta\omega_1$) based on the interference light generated by the light with the frequency $\omega_{1a}$ and light with the frequency $\omega_1$ to the phase meter 123.

The phase meter 123 measures a change in phase of the measurement beat signal with respect to the reference beat signal so as to determine a displacement $D(\omega_1)$ without consideration of the change of refractive index and supplies a signal concerning this displacement $D(\omega_1)$ to the calculator 124. The calculator 124 receives the signal from the phase meter 115 and the signal from the phase meter 123 and then determines and outputs, on the basis of the operation expression indicated by the above-mentioned equation (4), the true displacement D of the movable mirror 105 in which the length-measuring error due to the change of refractive index has been corrected.

As explained in the foregoing, in the fourth embodiment, the reference light reflected twice by the stationary mirror 104 and the measurement light reflected twice by the movable mirror 105 are received along light paths different from each other. Namely, in a double-path construction, the measurement light component with the frequency $\omega_2$ and the measurement light component with the frequency $\omega_3$ are independent from the reference light component with the frequency $\omega_2$ and the reference light component with the frequency $\omega_3$. As a result, crosstalk between the reference light and the measurement light for correcting the influence due to the change of refractive index can be substantially prevented from occurring, thereby enabling highly accurate measurement according to a double-path construction.

Figure 9:
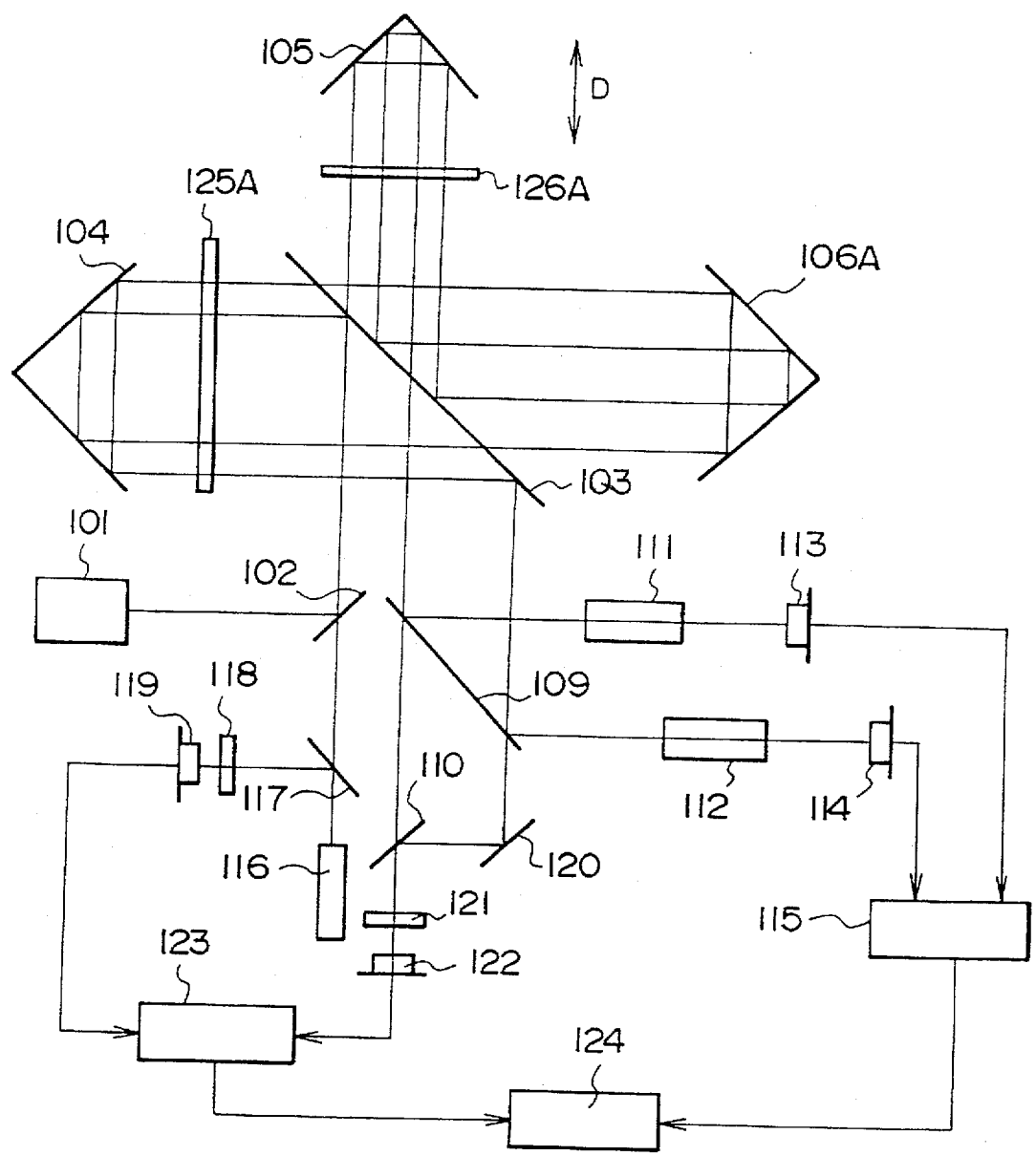
FIG. 9 is a view showing a schematic configuration of a fifth embodiment of the optical interference measuring apparatus in accordance with the present invention.

FIG. 9 is a view showing a schematic configuration of the fifth embodiment of the optical interference measuring apparatus in accordance with the present invention.

Though similar to the fourth embodiment (FIG. 8), the optical interference measuring apparatus of FIG. 9 basically differs therefrom in that a ¼-wave plate 125A and a ¼-wave plate 126A are respectively disposed between the polarization beam splitter 103 and the stationary mirror 104 and between the polarization beam splitter 103 and the movable mirror 105. Accordingly, in FIG. 9, the constituents having functions similar to those of the fourth embodiment are referred to with marks identical to those of FIG. 8. In the following, the fifth embodiment will be explained in consideration of its difference from the fourth embodiment.

In the fifth embodiment, the reference light reflected by the polarization beam splitter 103 is reflected by the stationary mirror 104 by way of the ¼-wave plate 125A and then returns to the polarization beam splitter 103 by way of the ¼-wave plate 125A along a first reference light path. Here, as the reference light passes through the ¼-wave plate 125A twice, its polarization direction rotates by 90°. Accordingly, the reference light which has been reflected by the polarization beam splitter 103 can be transmitted through the polarization beam splitter 103. The reference light transmitted through the polarization beam splitter 103 is reflected by the corner-cube prism 106A and then enters the polarization beam splitter 103. The reference light transmitted through the polarization beam splitter 103 is reflected by the stationary mirror 104 again by way of the ¼-wave plate 125A and then returns to the polarization beam splitter 103 by way of the ¼-wave plate 125A along a second reference light path which is different from the first reference light path. Thus, after having reciprocated through the reference light path to the stationary mirror 104 twice, the reference light returns to the polarization beam splitter 103.

On the other hand, the measurement light transmitted through the polarization beam splitter 103 is reflected by the movable mirror 105 by way of the ¼-wave plate 126A and then returns to the polarization beam splitter 103 by way of the ¼-wave plate 126A along a first measurement light path. The measurement light (whose polarization direction is rotated by 90° as it has passed through the ¼-wave plate 126A twice) reflected by the polarization beam splitter 103 is reflected by the corner-cube prism 106A and then enters the polarization beam splitter 103 along a light path different from that of the reference light. The measurement light reflected by the polarization beam splitter 103 is reflected by the movable mirror 105 again by way of the ¼-wave plate 126A and then returns to the polarization beam splitter 103 by way of the ¼-wave plate 126A along a second measurement light path which is different from the first measurement light path. Thus, after having reciprocated through the measurement light path to the movable mirror 105 twice, the measurement light returns to the polarization beam splitter 103.

Also in this fifth embodiment, the light path separating mechanism is placed (such as arranging the corner-cube prism 104, which is a reference reflector, the corner-cube prism 105, which is a measurement reflector, and the corner-cube prism 106A at their respective positions) where the incident point of the reference light entering the polarization beam splitter 103, by way of the second reference light path, and the incident point of the measurement light entering the polarization beam splitter 103, by way of the second measurement light path, do not substantially overlap each other.

Thus, the reference light component with the frequency $\omega_2$ and reference light component with the frequency $\omega_3$ emitted from the polarization beam splitter 103 and the measurement light component with the frequency $\omega_2$ and measurement light component with the frequency $\omega_3$ emitted from the polarization beam splitter 103 enter the frequency separating device 109 along light paths different from each other. Then, the above-mentioned measurement light components and reference light components reflected by the frequency separating device 109 respectively enter the SHG devices 111 and 112 along light paths different from each other.

Also in the fifth embodiment, as explained in the foregoing, the reference light reflected twice by the stationary mirror 104 and the measurement light reflected twice by the movable mirror 105 are received along light paths different from each other. Namely, in a double-path construction, the measurement light component with the frequency $\omega_2$ and the measurement light component with the frequency $\omega_3$ are independent from the reference light component with the frequency $\omega_2$ and the reference light component with the frequency $\omega_3$ without overlapping each other. As a result, crosstalk between the reference light and the measurement light for correcting the change of refractive index can be substantially prevented from occurring, thereby enabling highly accurate measurement according to a double-path construction.

According to the configuration of the fifth embodiment, in particular, the reflective mirrors 107 and 108 disposed between the polarization beam splitter 103 and the frequency separating device 109 in the fourth embodiment can be omitted. Also, the corner-cube prism 106 disposed between the polarization beam splitter 103 and the frequency separating device 109 in the fourth embodiment can be moved to a position opposite to the stationary mirror 104 with respect to the polarization beam splitter 103. As a result, the configuration of the optical system subsequent to the polarization beam splitter 103 can be simplified.

Figure 10:
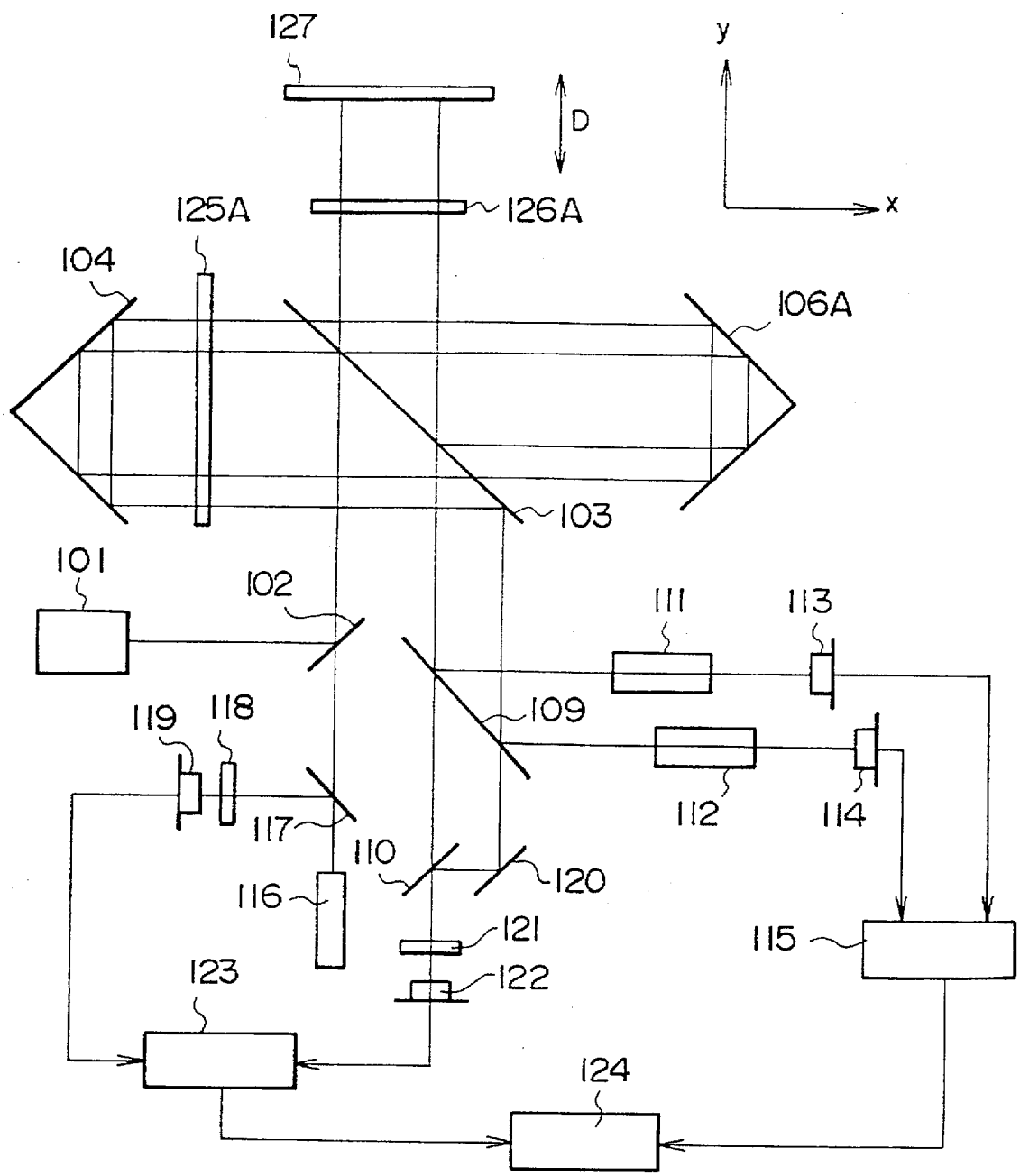
FIG. 10 is a view showing a schematic configuration of a sixth embodiment of the optical interference measuring apparatus in accordance with the present invention.

FIG. 10 is a view showing a schematic configuration of the sixth embodiment of the optical interference measuring apparatus in accordance with the present invention.

Though similar to the fifth embodiment (FIG. 9), the optical interference measuring apparatus of FIG. 10 basically differs therefrom in that a plane mirror 127 is used in place of the corner-cube prism as the movable mirror. Accordingly, in FIG. 10, the constituents having functions similar to those of the fifth embodiment are referred to with marks identical to those of FIG. 9. In the following, the sixth embodiment will be explained in consideration of its difference from the fifth embodiment.

In this sixth embodiment, by means of the plane mirror 127 as the movable mirror, even when the movable mirror 127 moves two-dimensionally in the y-direction and the x-direction in the drawing, the amount of movement of the movable mirror 127 in the y-direction can be measured. For example, when the optical interference measuring apparatus in accordance with the present invention is used in order to detect the position of a two-dimensional stage of an exposure apparatus (lithography stepper) for making semiconductor devices, liquid crystal display devices, and the like, since the movable mirror fixed to the two-dimensional stage moves two-dimensionally, the movable mirror is preferably a plane mirror having a reflective surface perpendicular to the y-direction (cf. FIG. 2).

Since the configuration and operation except for this point are basically the same as those of the fifth embodiment, their overlapping explanations are not repeated below.

Figure 11:
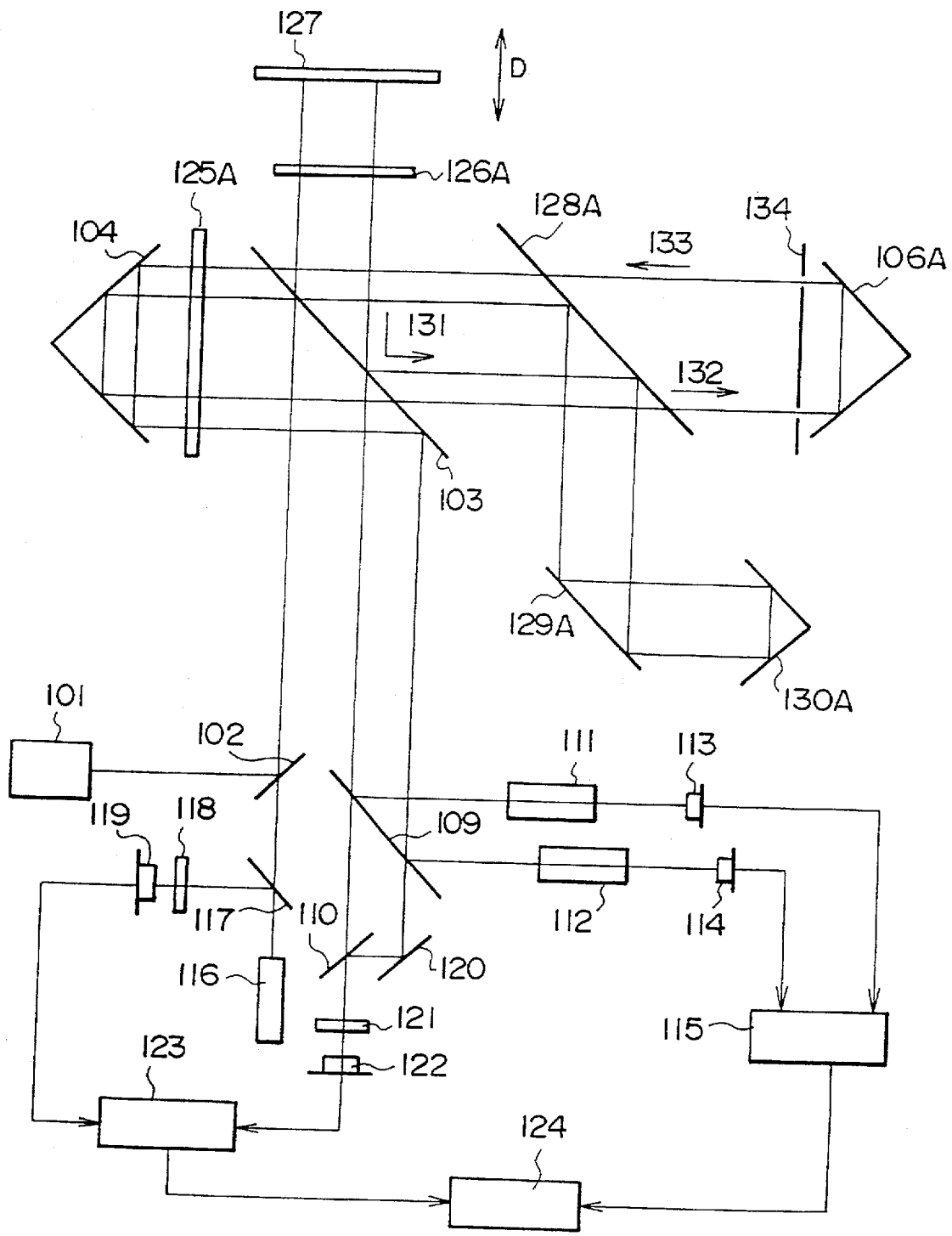
FIG. 11 is a view showing a schematic configuration of a seventh embodiment of the optical interference measuring apparatus in accordance with the present invention.

FIG. 11 is a view showing a schematic configuration of the seventh embodiment of the optical interference measuring apparatus in accordance with the present invention.

The optical interference measuring apparatus of FIG. 11 is similar to that of the sixth embodiment (FIG. 10). However, it basically differs from that of the sixth embodiment in that, in order to reduce the influence of stray light generated when the plane mirror 127 is used as the movable mirror, a polarization beam splitter 128A (first relay polarization separator), a polarization beam splitter 129A, and a corner-cube prism 130A (second relay reflector) are disposed. Accordingly, in FIG. 11, the constituents having functions similar to those of the sixth embodiment are referred to with marks identical to those of FIG. 10. In the following, the seventh embodiment will be explained in consideration of its difference from the sixth embodiment.

First, with reference to FIG. 10 again, the influence of stray light due to the plane mirror 127 will be explained.

In FIG. 10, the measurement light transmitted through the polarization beam splitter 103 is reflected by the movable mirror 127 by way of the ¼-wave plate 126A and then returns to the polarization beam splitter 103 by way of the ¼-wave plate 126A along the first measurement light path. Here, as the measurement light passes through the ¼-wave plate 126A twice, its polarization direction rotates by 90°. Accordingly, the measurement light which has been transmitted through the polarization beam splitter 103 is reflected thereby. The measurement light reflected by the polarization beam splitter 103 is reflected by the corner-cube prism 106A and then enters the polarization beam splitter 103 along a light path which is different from the that of the reference light. The measurement light reflected by the polarization beam splitter 103 is reflected again by the movable mirror 127 by way of the ¼-wave plate 126A and then returns to the polarization beam splitter 103 by way of the ¼-wave plate 126A along the second measurement light path which is different from the first measurement light path.

The measurement light which has returned to the polarization beam splitter 103 after having reciprocated through the measurement light path twice is light to be transmitted through the polarization beam splitter 103 so as to be incident on the frequency separating device 109. However, because there exist no polarization beam splitters having perfect performance (due to their manufacture), an error in performance of the polarization beam splitter 103 may make, though slightly, a part of the measurement light, which should be completely transmitted therethrough, be reflected to form stray light 131 (cf. FIG. 11). This stray light 131 may further reciprocate through the measurement light path twice (reciprocating four times in total) or intrude into the reference light path. As a result, crosstalk may occur, thereby making it impossible to effect highly accurate measurement.

Therefore, in this seventh embodiment, in order to reduce the influence of the stray light 131, the polarization beam splitter 128A and the polarization beam splitter 129A are disposed between the polarization beam splitter 103 and the corner-cube prism 130A.

Accordingly, in this seventh embodiment, the reference light reflected by the polarization beam splitter 103 is reflected by the stationary mirror 104 by way of the ¼-wave plate 125A and then returns to the polarization beam splitter 103 by way of the ¼-wave plate 125A. Here, as the reference light passes through the ¼-wave plate 125A twice, its polarization direction rotates by 90°. Accordingly, the reference light which has been reflected by the polarization beam splitter 103 can be transmitted therethrough. The reference light transmitted through the polarization beam splitter 103 is reflected by the corner-cube prism 106A by way of the polarization beam splitter 128A and then enters the polarization beam splitter 103 by way of the polarization beam splitter 128A. The reference light transmitted through the polarization beam splitter 103 is reflected again by the stationary mirror 104 by way of the ¼-wave plate 125A and then returns to the polarization beam splitter 103 by way of the ¼-wave plate 125A.

On the other hand, the measurement light transmitted through the polarization beam splitter 103 is reflected by the movable mirror 127 by way of the ¼-wave plate 126A and then returns to the polarization beam splitter 103 by way of the ¼-wave plate 126A. Here, as the measurement light passes through the ¼-wave plate 126A twice, its polarization direction rotates by 90°. Accordingly, the measurement light which has been transmitted through the polarization beam splitter 103 is reflected thereby. The measurement light reflected by the polarization beam splitter 103 is reflected by the corner-cube prism 130 by way of the polarization beam splitter 128A and the polarization beam splitter 129A then enters the polarization beam splitter 103 by way of the polarization beam splitter 129A and the polarization beam splitter 128A. The measurement light reflected by the polarization beam splitter 103 is reflected again by the movable mirror 127 by way of the ¼-wave plate 126A and then returns to the polarization beam splitter 103 by way of the ¼-wave plate 126A.

The stray light 131 derived from the measurement light which has returned to the polarization beam splitter 103 after having reciprocated through the measurement light path to the movable mirror 127 twice is a component which should originally be transmitted through the polarization beam splitters 103, 128A, and 129A. Accordingly, most of the stray light 131 is transmitted through the polarization beam splitter 128A. Since the stray light 131 transmitted through the polarization beam splitter 128A loses its light path to advance, the influence thereof is nullified. If the stray light 131 transmitted through the polarization beam splitter 128A is reflected by the corner-cube prism 106A to influence the accuracy in measurement, a stop 134 (first eliminating mechanism) through which only reference light components 132 and 133 can pass will be additionally provided so as to prevent undesirable influence of the stray light 131 from occurring.

Here, since the performance of the polarization beam splitter 128A is not perfect either, a part of the stray light 131 may be reflected by the polarization beam splitter 128A. However, since most of the stray light 131 reflected by the polarization beam splitter 128A is transmitted through the polarization beam splitter 129A and thereby loses its light path to advance, the influence thereof is nullified. Further, when a part of the stray light 131 is reflected by the polarization beam splitter 129A, it is reflected by the corner-cube prism 130A and then made incident on the polarization beam splitter 129A again. As a result, most of the stray light 131 is transmitted through the polarization beam splitter 129A and loses its light path to advance, thereby influence thereof is nullified (second eliminating mechanism).

Thus, even when the stray light 131 is generated due to the plane mirror 127, the stray light 131 can be successively reduced according to the operations of the three polarization beam splitters 103, 128A, and 129A. Namely, as the stray light 131 is reduced, crosstalk can be reduced, while highly accurate measurement can be performed according to a double-path construction.

Here, this seventh embodiment refers to a configuration in which the three polarization beam splitters 103, 128A, and 129A are disposed. However, when measurement with higher accuracy is required, additional polarization beam splitters may be successively connected to the polarization beam splitter 129A so as to further reduce the stray light 131.

Figure 12:
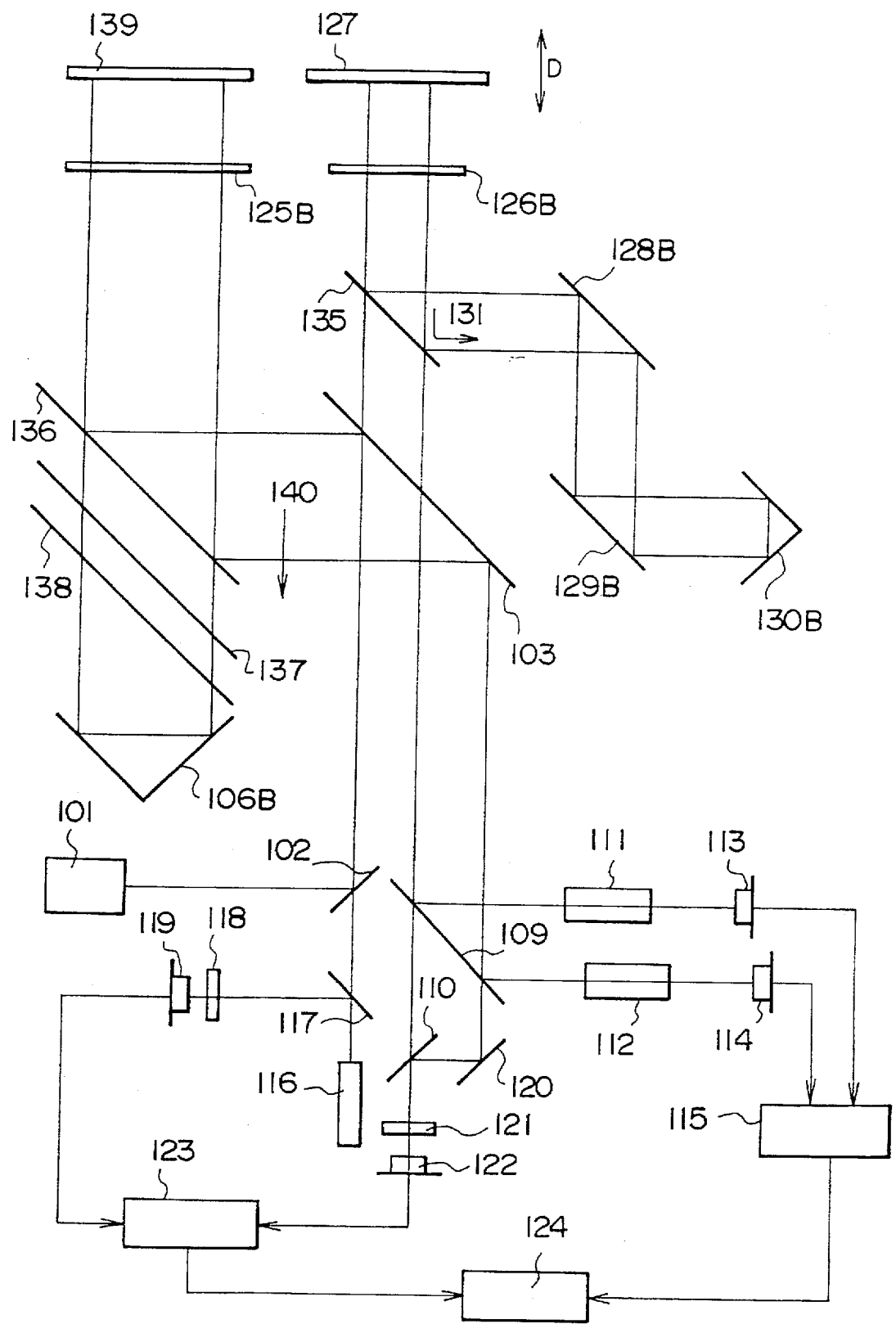
FIG. 12 is a view showing a schematic configuration of an eighth embodiment of the optical interference measuring apparatus in accordance with the present invention.

FIG. 12 is a view showing a schematic configuration of the eighth embodiment of the optical interference measuring apparatus in accordance with the present invention.

Though similar to that of the seventh embodiment (FIG. 11), the optical interference measuring apparatus of FIG. 12 basically differs therefrom in that a plane mirror 139 is used as the stationary mirror. Accordingly, in FIG. 12, the constituents having functions similar to those of the seventh embodiment are referred to with marks identical to those of FIG. 11. In the following, the eighth embodiment will be explained in consideration of its difference from the seventh embodiment.

In this eighth embodiment, since the plane mirrors 139 and 127 are respectively used as the stationary and movable mirrors, a polarization beam splitter 135 (third relay polarization separator) is disposed between the polarization beam splitter 103 and a ¼-wave plate 126B (second ¼-wave plate). Also, between the polarization beam splitter 103 (or a first ¼-wave plate 125B) and a corner-cube prism 106B (third relay reflector), a polarization beam splitter 136 (second relay polarization separator) and polarization beam splitters 137 and 138 are disposed. Here, the relay optical system of this embodiment is constituted by a first partial relay optical system including the second relay polarization separator 136, first ¼-wave plate 125B, and third relay reflector 106B and a second partial relay optical system including the third relay polarization separator 135, second ¼-wave plate 126B, and fourth relay reflector 130B.

Accordingly, in this eighth embodiment, the reference light reflected by the polarization beam splitter 103 is reflected by the stationary mirror 139 by way of the polarization beam splitter 136 and the ¼-wave plate 125B and then returns to the polarization beam splitter 136 by way of the ¼-wave plate 125B. Here, as the reference light passes through the ¼-wave plate 125B twice, its polarization direction rotates by 90°. Accordingly, the reference light which has been reflected by the polarization beam splitter 136 is transmitted therethrough. The reference light transmitted through the polarization beam splitter 136 is reflected by the corner-cube prism 106B by way of the polarization beam splitters 137 and 138 and then enters the polarization beam splitter 136 by way of the polarization beam splitters 138 and 137. The reference light transmitted through the polarization beam splitter 136 is reflected again by the stationary mirror 139 by way of the ¼-wave plate 125B and then returns to the polarization beam splitter 103 by way of the ¼-wave plate 125B and the polarization beam splitter 136.

On the other hand, the measurement light transmitted through the polarization beam splitter 103 is reflected by the movable mirror 127 by way of the polarization beam splitter 135 and the ¼-wave plate 126B and then returns to the polarization beam splitter 135 by way of the ¼-wave plate 126B. Here, as the measurement light passes through the ¼-wave plate 126B twice, its polarization direction rotates by 90°. Accordingly, the measurement light which has been transmitted through the polarization beam splitter 135 is reflected thereby. The measurement light reflected by the polarization beam splitter 135 is reflected by the corner-cube prism 130B by way of the polarization beam splitter 128B and the polarization beam splitter 129B and then enters the polarization beam splitter 135 by way of the polarization beam splitter 129B and the polarization beam splitter 128B. The measurement light reflected by the polarization beam splitter 135 is reflected again by the movable mirror 127 by way of the ¼-wave plate 126B and then returns to the polarization beam splitter 103 by way of the ¼-wave plate 126B and the polarization beam splitter 135.

The stray light 131 derived from the measurement light which has returned to the polarization beam splitter 135 after having reciprocated through the measurement light path to the movable mirror 127 twice is a component which should originally be transmitted through the polarization beam splitters 135, 128B, and 129B. Accordingly, as shown in the seventh embodiment, even when the stray light 131 is generated due to the plane mirror 127, the stray light 131 can be successively reduced according to the operations of the three polarization beam splitters 135, 128B, and 129B (fourth eliminating mechanism).

The reference light which has returned to the polarization beam splitter 136 after having reciprocated through the reference light path twice is light to be reflected by the polarization beam splitter 136 and the polarization beam splitter 103 so as to be made incident on the frequency separating device 109. However, there exist no polarization beam splitters having perfect performance (due to their manufacture), and an error in performance of the polarization beam splitter 136 may make, though slightly, a part of the reference light, which should be completely reflected thereby, to be transmitted therethrough to form stray light 140. This stray light 140 may further reciprocate through the reference light path twice (reciprocating four times in total). As a result, error interference light may occur, thereby making it impossible to effect highly accurate measurement.

Here, the stray light 140 derived from the reference light which has returned to the polarization beam splitter 136 after having reciprocated through the reference light path to the stationary mirror 139 twice is a component which should originally be reflected by the polarization beam splitters 136 to 138. Accordingly, most of the stray light 140 is reflected by the polarization beam splitter 137. Since the stray light 140 reflected by the polarization beam splitter 137 loses its light path to advance, the influence thereof is nullified (third eliminating mechanism).

Here, since the performance of the polarization beam splitter 137 is not perfect either, a part of the stray light 140 may be transmitted through the polarization beam splitter 137. However, since most of the stray light 140 transmitted through the polarization beam splitter 137 is reflected by the polarization beam splitter 138 and thereby loses its light path to advance, the influence thereof is nullified. Further, when a part of the stray light 140 is transmitted through the polarization beam splitter 138, it is reflected by the corner-cube prism 106B and then made incident on the polarization beam splitter 138 again. As a result, most of the stray light 140 is reflected by the polarization beam splitter 138 and loses its light path to advance, thereby influence thereof is nullified.

Thus, even when the stray light 140 is generated due to the plane mirror 139, the stray light 140 can be successively reduced according to the operations of the three polarization beam splitters 136 to 138. Namely, as the stray light 140 is reduced, crosstalk can be reduced, while highly accurate measurement can be performed according to a double-path construction.

In this eighth embodiment, the three polarization beam splitters 135, 128B, and 129B are disposed in the measurement light path while the three polarization beam splitters 136 to 138 are disposed in the reference light path. However, when measurement with higher accuracy is required, additional polarization beam splitters may be successively connected to the polarization beam splitter 129B and the polarization beam splitter 138 so as to further reduce the stray light 131 and the stray light 140, respectively.

Figure 13:
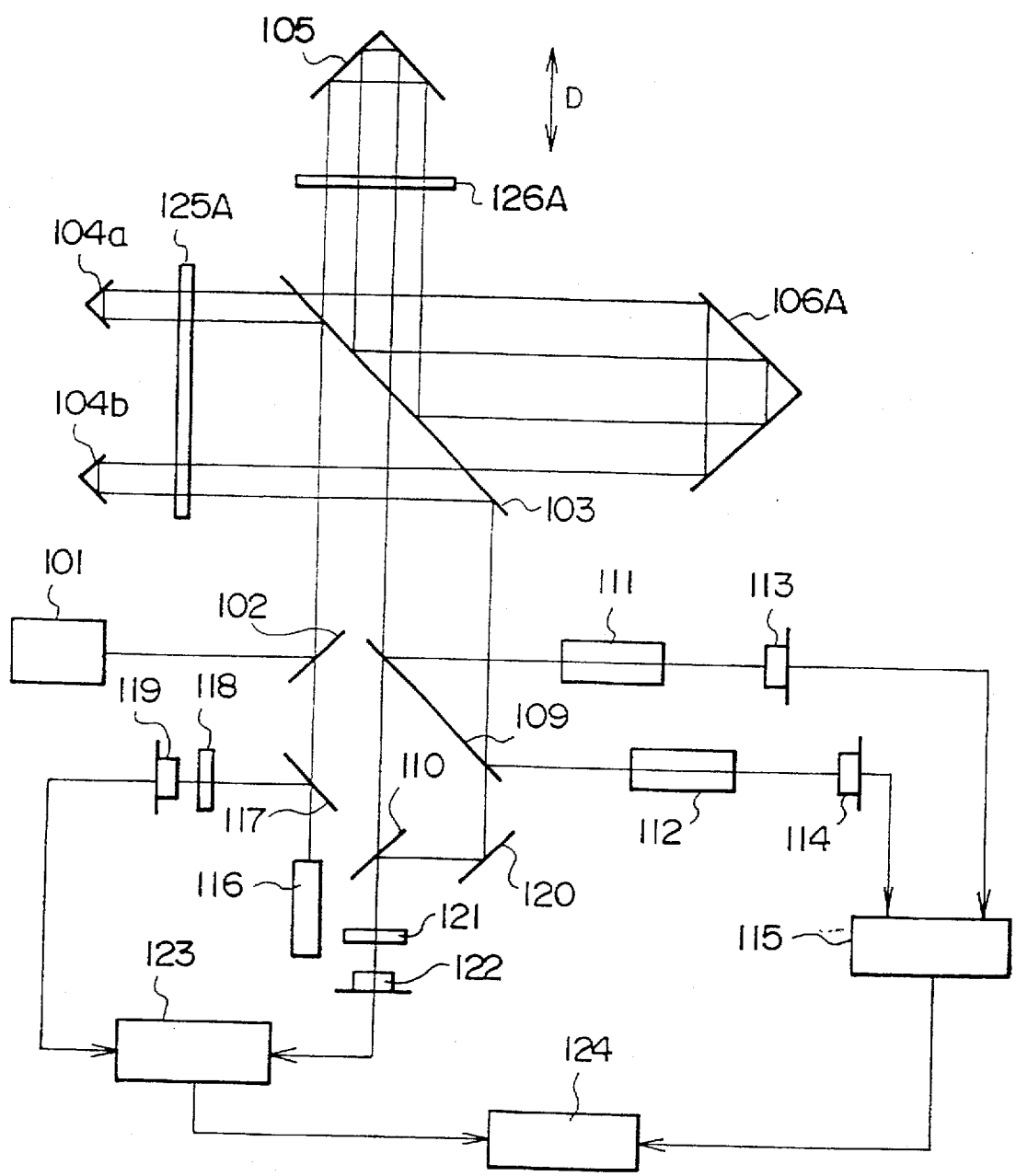
FIG. 13 is a view showing a schematic configuration of a ninth embodiment of the optical interference measuring apparatus in accordance with the present invention.

FIG. 13 is a view showing a schematic configuration of the ninth embodiment of the optical interference measuring apparatus in accordance with the present invention.

Though similar to that of the fifth embodiment (FIG. 9), the optical interference measuring apparatus of FIG. 13 basically differs therefrom in that the stationary mirror is constituted by a pair of corner-cube prisms 104a and 104b. Accordingly, in FIG. 13, the constituents having functions similar to those of the fifth embodiment are referred to with marks identical to those of FIG. 9. In the following, the ninth embodiment will be explained in consideration of its difference from the fifth embodiment.

In this ninth embodiment, the reference light reflected by the polarization beam splitter 103 is reflected by the corner-cube prism 104a by way of the ¼-wave plate 125A and then returns to the polarization beam splitter 103 by way of the ¼-wave plate 125A. Here, as the reference light passes through the ¼-wave plate 125A twice, its polarization direction rotates by 90°. Accordingly, the reference light which has been reflected by the polarization beam splitter 103 is transmitted therethrough. The reference light transmitted through the polarization beam splitter 103 is reflected by the corner-cube prism 106A and then enters the polarization beam splitter 103. The reference light transmitted through the polarization beam splitter 103 is reflected by the corner-cube prism 104b by way of the ¼-wave plate 125A and then returns to the polarization beam splitter 103 by way of the ¼-wave plate 125A.

Thus, in the ninth embodiment, the corner-cube prism 104a for the reference light at the first reciprocation and the corner-cube prism 104b for the reference light at the second reciprocation are provided in place of the large single corner-cube prism 104 in the fifth embodiment. As a pair of these relatively small corner-cube prisms are used, the optical system for the reference light path can have a smaller size.

In this ninth embodiment, a pair of corner-cube prisms are adopted as the stationary mirror in the optical interference measuring apparatus of the fifth embodiment. However, a pair of corner-cube prisms may be adopted as the stationary mirror in the optical interference measuring apparatus of the fourth, sixth, or seventh embodiments as well.

Also, a pair of corner-cube prisms may be used as the movable mirror instead of the stationary mirror. Further, when no plane mirror is used for either the stationary mirror or the movable mirror, a pair of corner-cube prisms may be used for each of the stationary mirror and the movable mirror.

Figure 14:
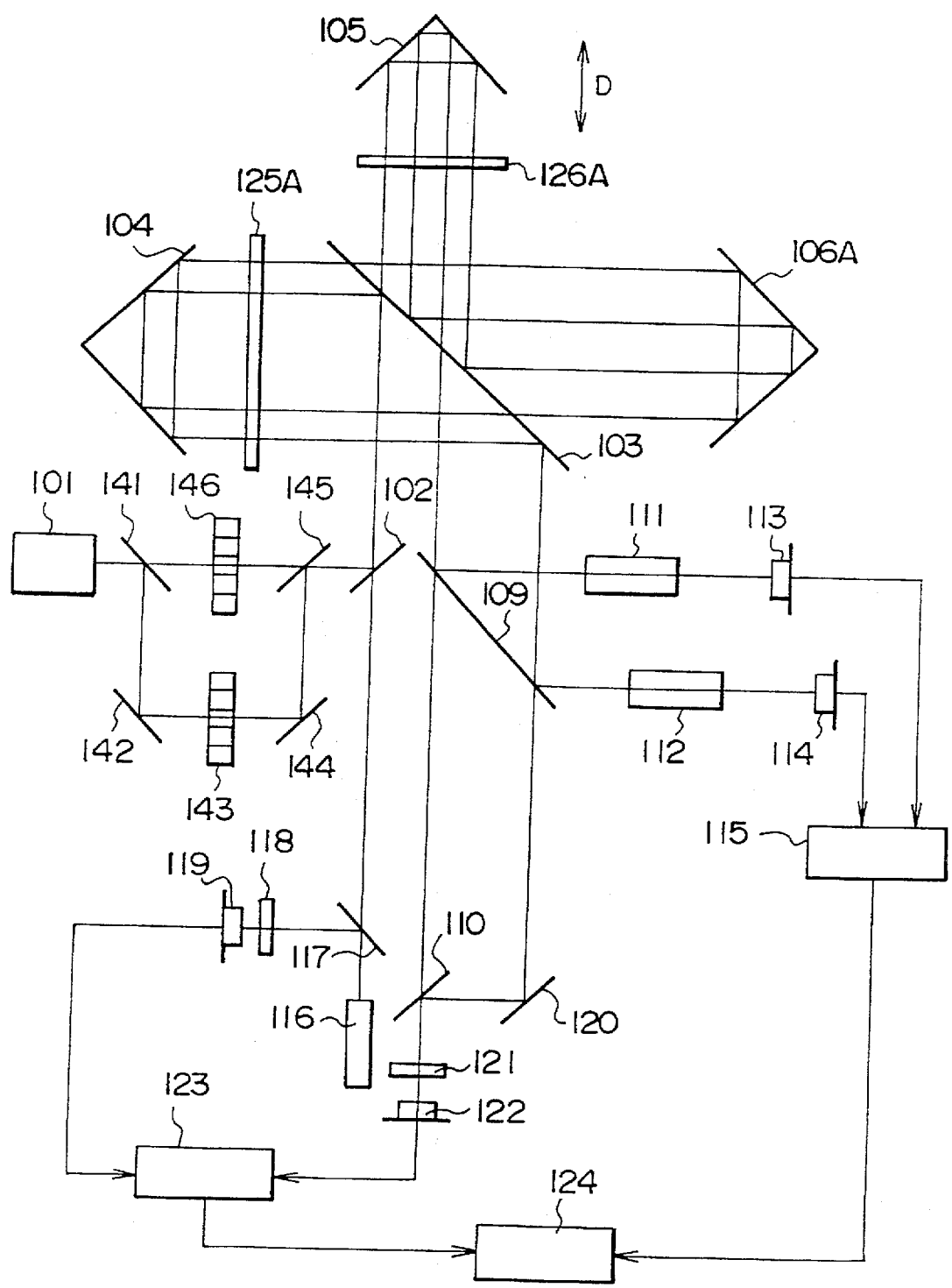
FIG. 14 is a view showing a schematic configuration of a tenth embodiment of the optical interference measuring apparatus in accordance with the present invention.

FIG. 14 is a view showing a schematic configuration of the tenth embodiment of the optical interference measuring apparatus in accordance with the present invention. In this tenth embodiment, so-called heterodyne interferometry is used for measuring the change of refractive index.

In the optical interference measuring apparatus of FIG. 14, in order to detect, according to heterodyne interferometry, interference light generated from the light with the frequency $\omega_2$ and light with the frequency $\omega_3$, a frequency separating device (frequency filter) 141, a frequency coupling device (frequency filter) 145, and a frequency shifter 146 are disposed between the light source 101 and the frequency coupling device 102. Except for this point, however, the configuration of the apparatus in FIG. 14 is basically identical to that of the fifth embodiment (FIG. 9). Accordingly, in FIG. 14, the constituents having functions similar to those of the fifth embodiment are referred to with marks identical to those of FIG. 9. In the following, the tenth embodiment will be explained in consideration of its difference from the fifth embodiment.

First, the case where a phase shifter 143 is not inserted in a light path will be explained.

The light with the frequency $\omega_2$ and light with the frequency $\omega_3$ emitted from the light source 101 enter the frequency filter 141. Each of the frequency filters 141 and 145 has a characteristic such that the light in the proximity of frequency $\omega_3$ is transmitted therethrough whereas the light with the frequency $\omega_2$ is reflected thereby. The light with the frequency $\omega_3$ transmitted thorough the frequency filter 141 becomes, by way of the frequency shifter 146, light with a frequency $\omega_{3a}$ ($\omega_{3a}=\omega_3+\Delta\omega_3$) which is slightly shifted from the frequency $\omega_3$. Here, the frequency shifter 146 is an acousto-optic device, for example. The light with the frequency $\omega_{3a}$ generated by way of the phase shifter 146 enters the frequency filter 145.

On the other hand, the light with the frequency $\omega_2$ reflected by the frequency filter 141 is made incident on the frequency filter 145 by way of a reflective mirror 142 and a reflective mirror 144. Thus, the light with the frequency $\omega_{3a}$ and the light with the frequency $\omega_2$ are coupled together on an identical light path again by the frequency filter 145. Thereafter, the light with the frequency $\omega_2$ and the light with the frequency $\omega_{3a}$ propagate through the light paths similar to those of the light with the frequency $\omega_2$ and the light with the frequency $\omega_3$ in the fifth embodiment and then are reflected independently from each other by the frequency separating device 109 as desired measurement light component and reference light component.

The measurement light component with the frequency $\omega_2$ becomes light with the frequency $\omega_3$ by being converted by the SHG device 111, whereas the measurement light component with the frequency $\omega_{3a}$ generated by way of the frequency shifter 146 is transmitted through the SHG device 111 as it is. Thus, unlike the fifth embodiment, two light components whose frequencies differ from each other by $\Delta\omega_3$, namely, the light with the frequency $\omega_3$ and the light with the frequency $\omega_{3a}$, interfere with each other in a heterodyne interferometry. Similarly, by way of the SHG device 112, the reference light component with the frequency $\omega_2$ and the reference light component with the frequency $\omega_3$ interfere with each other in a heterodyne interferometry.

Accordingly, both of the reference signal from the photoelectric converter 114 and the measurement signal from the photoelectric converter 113 become interference beat signals. As in the case of the fifth embodiment, the phase meter 115 determines $(D(\omega_3)-D(\omega_2))$ and supplies a signal concerning $(D(\omega_3)-D(\omega_2))$ to the calculator 124.

The calculator 124 receives the signal from the phase meter 123 and the signal from the phase meter 115 and, based on the above-mentioned equation (4), determines and outputs the true displacement D of the movable mirror 105 in which the length-measuring error due to the change of refractive index has been corrected.

Thus, also in the tenth embodiment, crosstalk between the reference light and the measurement light for correcting the change of refractive index can be substantially prevented from occurring, thereby enabling highly accurate measurement in a double-path construction.

Also, in this tenth embodiment, the measurement of change of refractive index by means of the light with the frequency $\omega_2$ and the light with the frequency $\omega_3$ is effected by heterodyne interferometry. Accordingly, it is unlikely to be subjected to an error caused by change of refractive index in output of the light source 101, thereby $(D(\omega_3)-D(\omega_2))$ can be detected correctly. As a result, accuracy in detection of the true displacement D can be improved.

Also, as shown in FIG. 14, a frequency shifter 143 may be further disposed between the reflective mirror 142 and the reflective mirror 144 so as to shift, in terms of frequency, the light with the frequency $\omega_2$ and the light with the frequency $\omega_3$ to the light with the frequency $\omega_{2a}$ ($\omega_{2a}=\omega_2+\Delta\omega_2$) and the light with the frequency $\omega_{3a}$, respectively. Alternatively, without the frequency shifter 146 being inserted, the frequency shifter 143 may be provided alone so as to shift, in terms of frequency, the light with the frequency $\omega_2$ to the light with the frequency $\omega_{2a}$. Thus, as a frequency shifter is provided, the light returning to the light source 101 is prevented from occurring, thereby the error in measurement due to the light returning to the light source 101 can be reduced.

In this tenth embodiment, the measurement of refractive index according to heterodyne interferometry is applied to the optical interference measuring apparatus of FIG. 9 (fifth embodiment). However, the measurement of refractive index according to heterodyne interferometry may be similarly applied to the third, fourth, or sixth to ninth embodiment as well.

Also, in the foregoing embodiments, the length-measuring light source (12 or 116) emits two light components whose polarization directions are orthogonal to each other while their frequencies are slightly different from each other, and the displacement of the movable mirror 6 is measured according to heterodyne interferometry. However, the displacement of the movable mirror 6 may be measured according to homodyne interferometry based on the light having a single frequency emitted from the length-measuring light source.

In the optical interference measuring apparatus in accordance with the present invention, change of refractive index of a gas in its light path is measured, and then, in response to the measured change of refractive index, the displacement of a movable mirror measured by a length-measuring interferometer is corrected so as to determine the true displacement of the movable mirror. Accordingly, the change of refractive index of the gas has to be minimized at a portion where the light path of the length-measuring interferometer and the light path at which the change of refractive index is measured are separated from each other. Specifically, it is preferable that light paths where the length-measuring light transmitted through the reference light path or measurement light path and the light with the frequency $\omega_2$ and the light with the frequency $\omega_3$ are separated from each other, namely, light paths between the frequency separating device (7 or 109) and the SHG devices (8 and 9 or 111 and 112) and polarization beam splitters (15 or 110), be configured as short as possible or covered with a sealing tube or the like. Accordingly, the influence of the change of refractive index of the gas in these light paths can be suppressed, thereby measurement can be effected with a higher accuracy.

Figure 15:
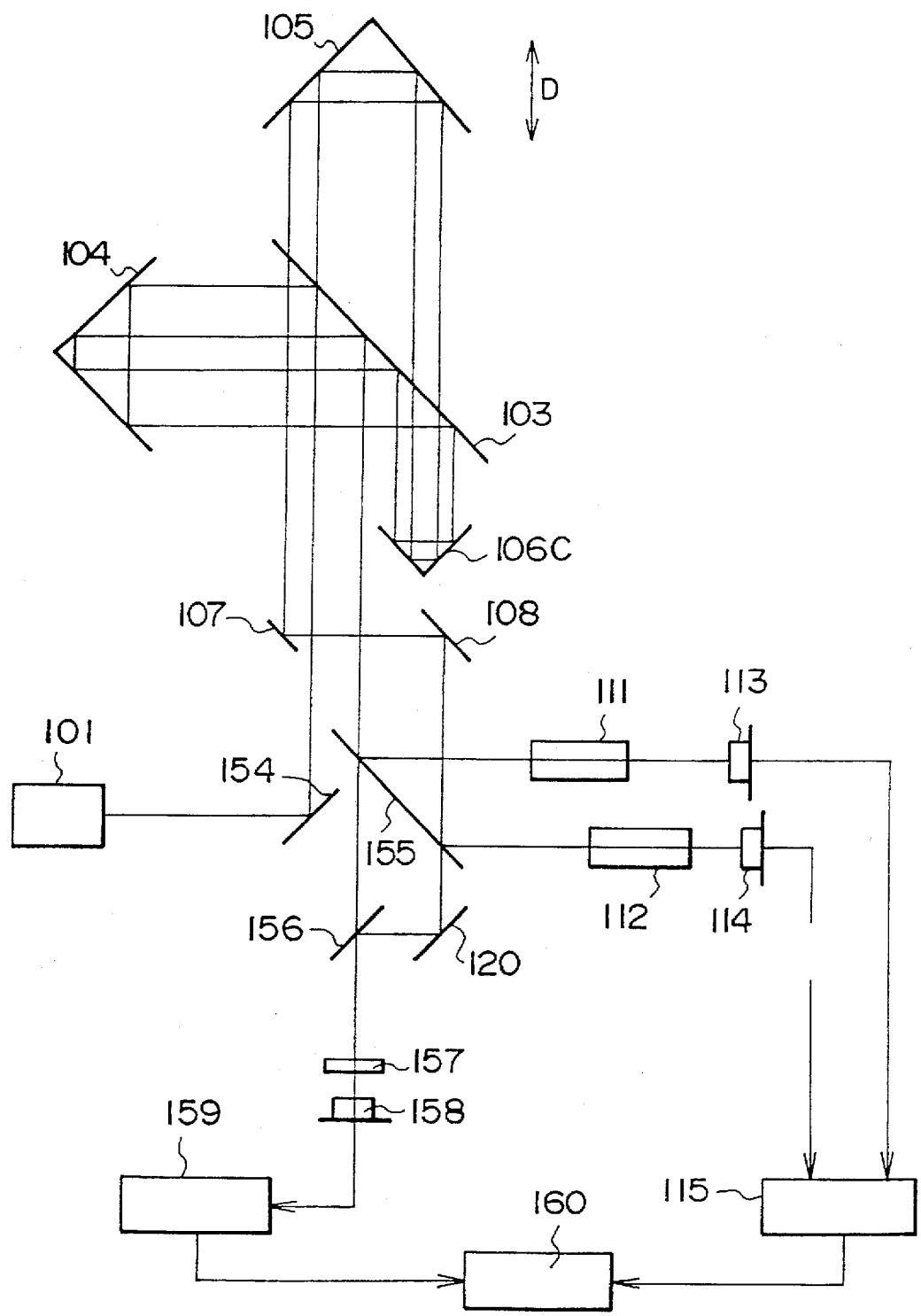
FIG. 15 is a view showing a schematic configuration of an eleventh embodiment of the optical interference measuring apparatus in accordance with the present invention.

FIG. 15 is a view showing a schematic configuration of the eleventh embodiment of the optical interference measuring apparatus in accordance with the present invention. This eleventh embodiment is a modified example of the fourth embodiment in FIG. 8. Accordingly, in FIG. 15, the constituents having functions similar to those of the fourth embodiment are referred to with marks identical to those of FIG. 8. In the optical interference measuring apparatus of FIG. 15, unlike the fourth embodiment in which the light from the length-measuring light (light in the proximity of frequency $\omega_1$) is used to measure the displacement of the movable mirror 105, the light with the frequency $\omega_2$ from the light source 101 is used to measure the displacement of the movable mirror 105.

From the light source 101, the light with the frequency $\omega_2$ and the light with the frequency $\omega_3$ are emitted toward a reflective mirror 154 and the polarization beam splitter 103. At this time, the polarization direction of each of the light with the frequency $\omega_2$ and light with the frequency $\omega_3$ is, for example, inclined with respect to the paper surface by 45°. At the polarization beam splitter 103, the light having a polarization direction perpendicular to the paper surface is reflected thereby while the light having a polarization direction in parallel to the paper surface is transmitted therethrough. The reference light component with the frequency $\omega_2$ and reference light component with the frequency $\omega_3$ reflected by the polarization beam splitter 103 are propagated through the reference light path. Namely, after having reciprocated through the light path between the polarization beam splitter 103 and the corner-cube prism 104 twice by means of a corner-cube prism 106C, they are emitted from the polarization beam splitter 103. On the other hand, the measurement light component with the frequency $\omega_2$ and measurement light component with the frequency $\omega_3$ transmitted through the polarization beam splitter 103 are propagated through the measurement light path. Namely, after having reciprocated through the light path between the polarization beam splitter 103 and the corner-cube prism 105 twice by means of the corner-cube prism 106C, they are emitted from the polarization beam splitter 103.

The measurement light emitted from the polarization beam splitter 103 enters a beam splitter 155 by way of the reflective mirrors 107 and 108. Similarly, the reference light emitted from the polarization beam splitter 103 directly enters the beam splitter 155. At the beam splitter 155, a part of the light with the frequency $\omega_2$ in the reference light component and measurement light component is transmitted therethrough, while the rest of the light with the frequency $\omega_2$ and the light with the frequency $\omega_3$ are reflected thereby. The measurement light component with the frequency $\omega_2$ (light having a lower frequency) reflected by the beam splitter 155 is converted into light with the frequency $\omega_3$ (=2$\omega_2$) upon SHG conversion by the SHG device 112. Thus, the light with the frequency $\omega_3$ subjected to the SHG conversion and the measurement light component with the frequency $\omega_3$ reflected by the beam splitter 155 interfere with each other, and the resulting interference light is detected by the photoelectric converter 114. The signal from the photoelectric converter 114 is input into the phase meter 115.

Similarly, the reference light component with the frequency $\omega_2$ (light having a lower frequency) reflected by the beam splitter 155 is converted into light with the frequency $\omega_3$ (=2$\omega_2$) upon SHG conversion by the SHG device 111. Thus, the light with the frequency $\omega_3$ subjected to the SHG conversion and the reference light component with the frequency $\omega_3$ reflected by the beam splitter 155 interfere with each other, and the resulting interference light is detected by the photoelectric converter 113. The signal from the photoelectric converter 113 is input into the phase meter 115.

As in the case of the fourth embodiment, the phase meter 115 determines ($D(\omega_3)-D(\omega_2)$) from the signal of the photoelectric converter 113 and the signal of the photoelectric converter 114 and outputs it to a calculator 160.

On the other hand, the measurement light component with the frequency $\omega_2$ transmitted through the beam splitter 155 is reflected by the reflective mirror 120 and then, at a beam splitter 156, coupled with the reference light component with the frequency $\omega_2$ transmitted through the beam splitter 155. The measurement light component and reference light component thus coupled by way of the beam splitter 156 interfere with each other after passing through a polarization plate 157. The interference light generated by the measurement light component and the reference light component is detected by a photoelectric converter 158, and a signal from the photoelectric converter 158 is input into a phase meter 159.

From the signal of the photoelectric converter 158, the phase meter 159 determines $D(\omega_2)$ and outputs it to the calculator 160. From the signal of the phase meter 115 and the signal of the phase meter 159, the calculator 160 can determine the true displacement D of the movable mirror 105. This operation can be realized when the above-mentioned equation (4) is processed with $\omega_1=\omega_2$. Namely, in this eleventh embodiment, the displacement of the movable mirror can be measured with the light with the frequency $\omega_2$, thereby the light source 116 in the fourth embodiment becomes unnecessary.

Figure 16:
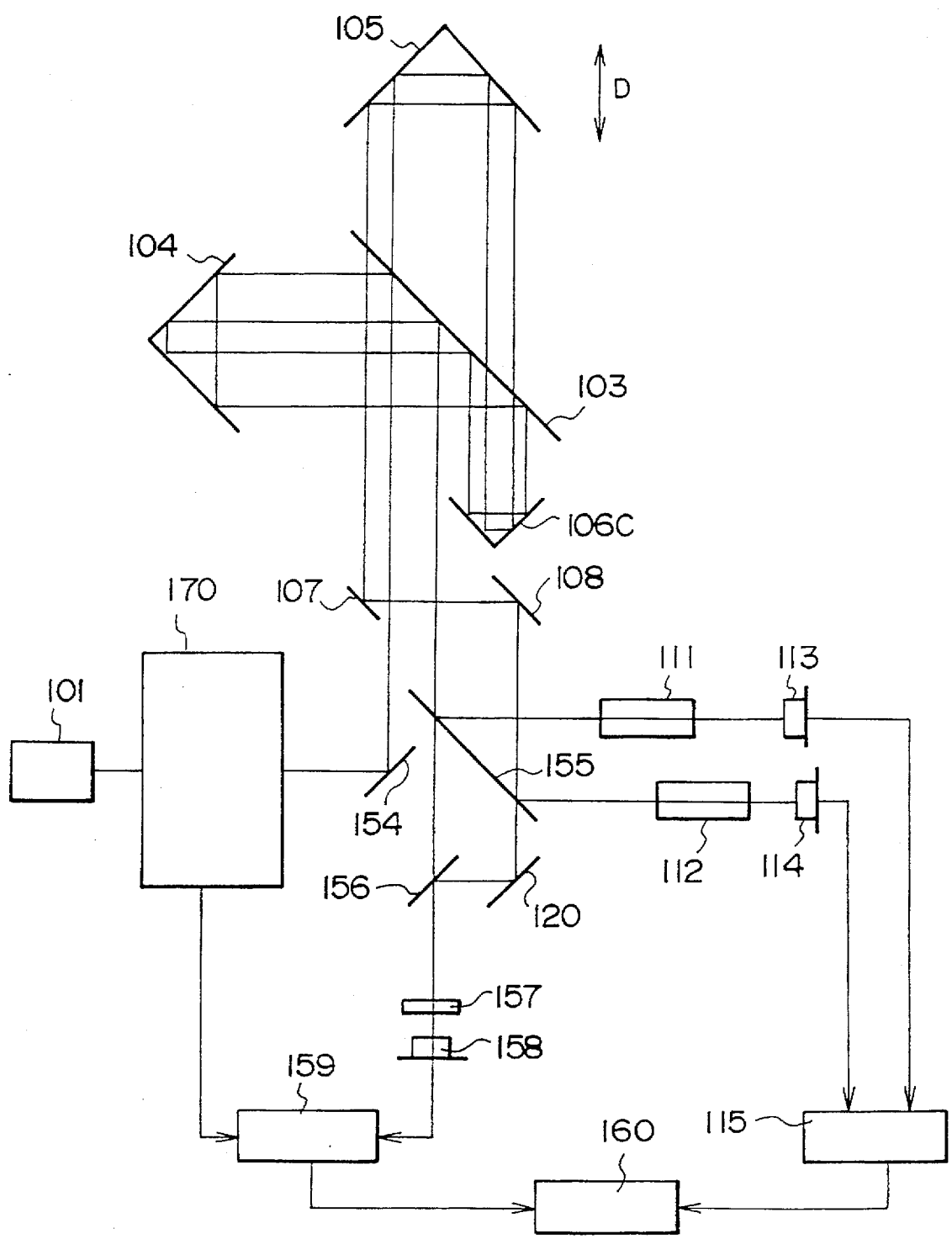
FIG. 16 is a view showing a schematic configuration of a twelfth embodiment of the optical interference measuring apparatus in accordance with the present invention.
Figure 17:
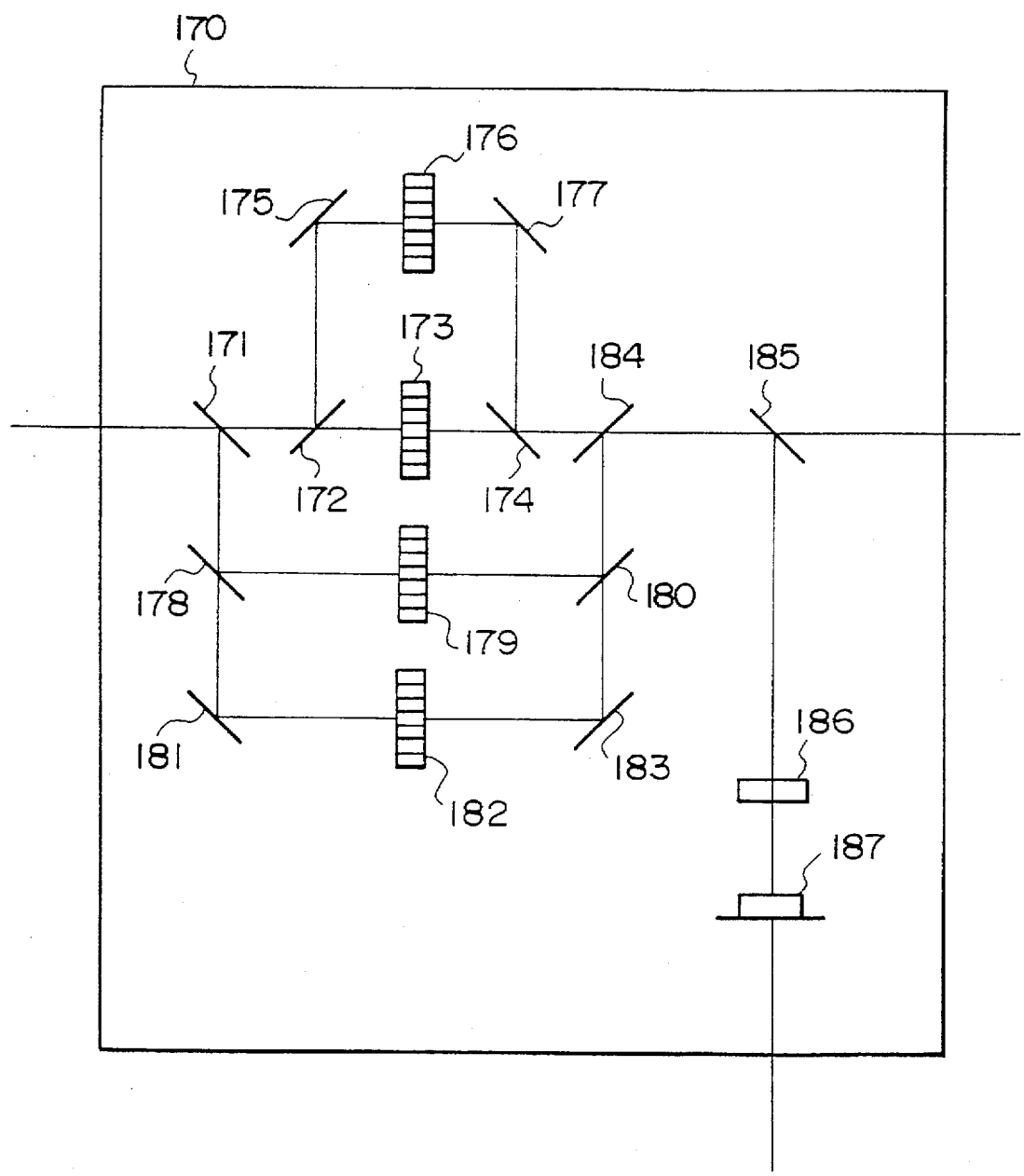
FIG. 17 is a view showing a schematic configuration of a frequency shifting section 170 shown in FIG. 16.

FIG. 16 is a view showing a schematic configuration of the twelfth embodiment of the optical interference measuring apparatus in accordance with the present invention. Also, FIG. 17 is a view schematically showing a configuration of a frequency shifting section 170 in FIG. 16.

This optical interference measuring apparatus of FIG. 16 (twelfth embodiment) is a modified example of the optical interference measuring apparatus of the eleventh embodiment and relates to an embodiment in which the measurement of displacement of the moveable mirror and the measurement of the changes of refractive index of the air and other gases in the measurement light path are performed according to heterodyne measurement method. Accordingly, in FIG. 16, the constituents having functions similar to those of the eleventh embodiment are referred to with marks identical to those of FIG. 15.

From the light source 101, light with the frequency $\omega_2$ and light with the frequency $\omega_3$ are emitted toward the frequency shifting section 170. At this time, the polarization direction of each of the light with the frequency $\omega_2$ and light with the frequency $\omega_3$ is, for example, inclined with respect to the paper surface of FIG. 16 by 45°. With reference to FIG. 17, the light with the frequency $\omega_3$ which has entered the frequency shifting section 170 is transmitted through a dichroic mirror 171 so as to enter a polarization beam splitter 172. The light with the frequency $\omega_3$ reflected by the polarization beam splitter 172 is reflected by a reflective mirror 175 and then enters a frequency shifter 176, where it is shifted, in terms of frequency, to light with a frequency $\omega_{3a}$ ($\omega_{3a}=\omega_3+\Delta\omega_a$) which is slightly shifted from the frequency $\omega_3$. On the other hand, the light with the frequency $\omega_3$ transmitted through the polarization beam splitter 172 is shifted by a frequency shifter 173, in terms of frequency, to light with a frequency $\omega_{3b}$ ($\omega_{3b}=\omega_3+\Delta\omega_b$).

The light with the frequency $\omega_{3a}$ transmitted through the frequency shifter 176 enters a polarization beam splitter 174 after being reflected by a reflective mirror 177, whereas the light with the frequency $\omega_{3b}$ transmitted through the frequency shifter 173 directly enters the polarization beam splitter 174. Thus, the light with the frequency $\omega_{3a}$ and light with the frequency $\omega_{3b}$ coupled together again by the polarization beam splitter 174 enter a dichroic mirror 184.

On the other hand, the light with the frequency $\omega_2$ from the light source 101 is reflected by the dichroic mirror 171 and then enters a polarization beam splitter 178. The light with the frequency $\omega_2$ reflected by the polarization beam splitter 178 is shifted by a frequency shifter 179, in terms of frequency, to light with a frequency $\omega_{2a}$ ($\omega_{2a}=\omega_2+\Delta\omega_c$). On the other hand, the light with the frequency $\omega_2$ transmitted through the polarization beam splitter 178 enters, by way of a reflective mirror 181, a frequency shifter 182, where it is shifted, in terms of frequency, to light with a frequency $\omega_{2b}$ ($\omega_{2b}=\omega_2+\Delta\omega_d$).

The light with the frequency $\omega_{2a}$ transmitted through the frequency shifter 179 directly enters a polarization beam splitter 180, whereas the light with the frequency $\omega_{2b}$ transmitted through the frequency shifter 182 enters the polarization beam splitter 180 after being reflected by a reflective mirror 183. Thus, the light with the frequency $\omega_{2a}$ and light with the frequency $\omega_{2b}$ coupled together again by the polarization beam splitter 182 enter the dichroic mirror 184.

The light with the frequency $\omega_{3a}$ and light with the frequency $\omega_{3b}$ and the light with the frequency $\omega_{2a}$ and light with the frequency $\omega_{2b}$ coupled together by the dichroic mirror 184 are emitted from the frequency shifting section 170 by way of a beam splitter 185.

With reference to FIG. 16 again, the respective light components emitted from the frequency shifting section 170 are detected by the photoelectric converters 113 and 114 along paths similar to those in the eleventh embodiment by way of the beam splitter 103. Accordingly, overlapping explanations for detailed paths of the individual light components are not repeated here.

Here, the respective frequency shift amounts $\Delta\omega_a$, $\Delta\omega_b$, $\Delta\omega_c$, and $\Delta\omega_d$ at the frequency shifters 176, 173, 179, and 182 differ from each other. Then, the light with the frequency $\omega_{3a}$ transmitted through the reference light path and the light with the frequency $\omega_{2a}$ which has been converted by the SHG device 111 into the light with the frequency 2$\omega_{2a}$ interfere with each other. Also, the light with the frequency $\omega_{3b}$ which has traveled through the measurement light path and the light with the frequency $\omega_{2b}$ which has been converted by the SHG device 112 into the light with the frequency $2\omega_{2b}$ interfere with each other. Since the phase meter 115 compares interference signals respectively corresponding to two interference light components with each other, heterodyne frequencies $(2\Delta\omega_c-\Delta\omega_a)$ and $(2\Delta\omega_d-\Delta\omega_b)$ in the respective interference signals have to be made equal to each other.

The beam splitter 185 in the frequency shifting section 170 reflects a part of the light with the frequency $\omega_{2a}$ and light with the frequency $\omega_{2b}$ incident thereon while transmitting therethrough the rest of the light with the frequency $\omega_{2a}$ and light with the frequency $\omega_{2b}$ as well as the light with the frequency $\omega_{3a}$ and light with the frequency $\omega_{3b}$. The light with the frequency $\omega_{2a}$ and light with the frequency $\omega_{2b}$ reflected by the beam splitter 185 interfere with each other by way of a polarizer 186. The resulting interference light is detected by a photoelectric converter 187, which then outputs thus detected signal to the phase meter 159. Based on a signal from the photoelectric converter 158 which detects the interference light generated by the light with the frequency $\omega_{2a}$ transmitted through the reference light path and the light with the frequency $\omega_{2b}$ transmitted through the measurement light path and a signal from the photoelectric converter 187, the phase meter 159 measures the displacement of the movable mirror 105.

In order to constitute the optical interference measuring apparatus of the eleventh or twelfth embodiment, as compared with the fourth embodiment, optical devices having special functions such as beam splitters 155 and 185 have to be used. However, unlike the fourth embodiment in which optical devices such as polarization beam splitter have identical functions with respect to three frequency light components, it is sufficient for the optical devices to function with respect to two frequency light components, thereby it is advantageous in terms of the design of optical devices. Also, since the light source 116 becomes unnecessary, the configuration of the optical interference measuring apparatus becomes simple while its optical adjustment becomes easy.

Also, the configuration of the eleventh and twelfth embodiments, in which the displacement of the movable mirror is measured by the light with the frequency $\omega_2$ derived from the light source 101 such that the light source 116 becomes unnecessary, is applicable not only to the fourth embodiment but also to the first to third embodiments and the fifth to tenth embodiments similarly. In particular, in the fifth to tenth embodiments, the optical devices constituting the optical interference measurement apparatus include a wave plate. Accordingly, the wave plate may function with respect to not three but two frequency light components alone, thereby making it advantageous in terms of optical construction.

As explained in the foregoing, in accordance with the present invention, since the reference light and the measurement light are received along light paths different from each other, crosstalk between the reference light and the measurement light for correcting the change of refractive index can be substantially prevented from occurring.

Also, according to the fourth to eleventh embodiments of the present invention, crosstalk between the reference light and the measurement light for correcting the change of refractive index can be substantially prevented from occurring, while highly accurate measurement can be effected in a double-path construction.

What is claimed is:

1. An apparatus in which measurement light propagated through a measurement optical path including a measurement reflector which is at least movable along said measurement optical path and reference light propagated through a reference optical path including a fixed reference reflector are made to interfere with each other so as to measure a displacement of said measurement reflector, said apparatus comprising:

a light emitting system for emitting, along an identical optical path, first light having a predetermined frequency and second light and third light respectively having frequencies which are different from each other;

a main polarization separator which divides said first light into a first measurement light component included in said measurement light introduced into said measurement optical path and a first reference light component included in said reference light introduced into said reference optical path which are polarized light components different from each other, and divides said second light into a second measurement light component included in said measurement light and a second reference light component included in said reference light which are polarized light components different from each other, and divides said third light into a third measurement light component included in said measurement light and a third reference light component included in the reference light which are polarized light components different from each other;

a frequency separating system for separating, in terms of frequency, the measurement light propagated through said measurement optical path into said first measurement light component and said second and third measurement light components, while separating, in terms of frequency, the reference light propagated through said reference optical path into said first reference light component and said second and third reference light components;

a first interference light generating system for generating first interference light from said first reference light component and said first measurement light component;

a second interference light generating system for generating second interference light by converting one of the frequencies of said second measurement light component and said third measurement light component so as to substantially coincide with the other of the frequencies of said second measurement light component and said third measurement light component;

a third interference light generating system for generating third interference light by converting one of the frequencies of said second reference light component and said third reference light component so as to substantially coincide with the other of the frequencies of said second reference light component and said third reference light component;

an optical path separating mechanism for spatially separating, with respect to at least said second light and third light, an optical path of said measurement light which enters said second interference light generating system after being propagated through said measurement optical path and an optical path of the reference light which enters said third interference light generating system after being propagated through said reference optical path from each other; and a computing unit which, based on information about fluctuation in refractive index in said measurement optical path and reference optical path measured from said second interference light and third interference light, corrects information about displacement of said measurement reflector obtained from said first interference light so as to determine an amount of displacement of said measurement reflector.

2. An apparatus according to claim 1,
wherein said optical path separating mechanism includes said measurement reflector and said reference reflector which are disposed at positions where the measurement light which is emitted from said main polarization separator after having propagated through said measurement optical path and the reference light which is emitted from said main polarization separator after having propagated through said reference optical path are spatially separated from each other,
whereby the measurement light and reference light which are emitted from said main polarization separator and independent from each other enter said frequency separating system along optical paths spatially separated from each other.

3. An apparatus according to claim 2,
wherein said measurement reflector and reference reflector are respectively disposed at positions where an incident position at which said measurement light reflected by said measurement reflector is made incident on said main polarization separator and an incident position at which said reference light reflected by said reference reflector is made incident on said main polarization separator are prevented from substantially overlapping each other.

4. An apparatus according to claim 2,
wherein said frequency separating system includes a first frequency separator for separating, in terms of frequency, the reference light propagated through said reference optical path into said first reference light component and said second and third reference light components and a second frequency separator for separating, in terms of frequency, the measurement light propagated through said measurement optical path into said first measurement light component and said second and third measurement light components;
wherein at least one of said first frequency separator and second frequency separator is disposed in an optical path upstream a point where said first light propagated through said reference optical path and said first light propagated through said measurement optical path are substantially coupled together; and
wherein said optical path separating mechanism further includes said first frequency separator and said second frequency separator.

5. An apparatus according to claim 4,
wherein said first frequency separator includes a dichroic mirror which has a characteristic such that said second and third reference light components in said reference light reflected by said reference reflector are reflected thereby while said first reference light component in said reference light is transmitted therethrough; and
wherein said second frequency separator includes a dichroic mirror which is disposed in an optical path of the measurement light reflected by said measurement reflector and has a characteristic such that said second and third measurement light components in said measurement light are reflected thereby while said first measurement light component in said measurement light is transmitted therethrough.

6. An apparatus according to claim 1, further comprising a relay optical system for reciprocating said reference light containing said first, second, and third reference light components along said reference optical path at least twice while reciprocating said measurement light containing said first, second, and third measurement light components along said measurement optical path the same number of times as said reference light reciprocates along said reference optical path.

7. An apparatus according to claim 6,
wherein said relay optical system comprises a first relay reflector which reflects the reference light, which has arrived there by way of said main polarization separator after having reciprocated through said reference optical path once, so as to guide it to said reference reflector by way of said main polarization separator again, while reflecting the measurement light, which has arrived there by way of said main polarization separator after having reciprocated through said measurement optical path once, so as to guide it to said measurement reflector by way of said main polarization separator again; and
wherein said first relay reflector is disposed at a position where the optical path of said reference light between said first relay reflector and said main polarization separator and the optical path of said measurement light between said first relay reflector and said main polarization separator are spatially separated from each other.

8. An apparatus according to claim 7,
wherein said relay optical system further comprises:
a first polarization direction converter for converting a polarization direction of the reference optical reciprocating through the reference light path between said reference reflector and said main polarization separator into a predetermined polarization direction; and
a second polarization direction converter for converting a polarization direction of the measurement optical reciprocating through the measurement light path between said measurement reflector and said main polarization separator into a predetermined polarization direction.

9. An apparatus according to claim 8,
wherein said first polarization direction converter includes a ¼-wave plate; and
wherein said second polarization direction converter includes a ¼-wave plate.

10. An apparatus according to claim 7,
wherein said relay optical system further comprises:
a first relay polarization separator for changing an optical path of the reference light which has arrived there by way of said main polarization separator after having reciprocated through said reference optical path once or for changing an optical path of the measurement light which has arrived there by way of said main polarization separator after having reciprocated through said measurement optical path once; and
a second relay reflector for reflecting, of said measurement light or said reference light, the light whose optical path has been changed by said first relay polarization separator, so as to guide it to said relay polarization separator again.

11. An apparatus according to claim 10,
wherein said relay optical system further comprises:

a first eliminating mechanism for eliminating stray light mixed into the light propagated through the optical path between said first relay polarization separator and said first relay reflector; and a second eliminating mechanism for eliminating stray light mixed into the light propagated through the optical path between said first relay polarization separator and said second relay reflector.

12. An apparatus according to claim 11, wherein said first eliminating mechanism includes a stop through which only one of said measurement light and reference light passes; and wherein said second eliminating mechanism includes a polarization beam splitter for reducing the stray light included in one of said measurement light and reference light.

13. An apparatus according to claim 6, wherein said relay optical system further comprises:
 a first partial relay optical system for reflecting said reference light, which has reciprocated through the reference optical path once, so as to guide it to said reference reflector without it passing through said main polarization separator; and
 a second partial relay optical system for reflecting the measurement light, which has reciprocated through said measurement optical path once, so as to guide it to said measurement reflector without it passing through said main polarization separator.

14. An apparatus according to claim 13, wherein said first partial relay optical system includes a second relay polarization separator disposed in the optical path between said reference reflector and said main polarization separator, a first ¼-wave plate disposed in the optical path between said second relay polarization separator and said reference reflector, and a third relay reflector for reflecting the reference light, which has arrived there by way of said second relay polarization separator after having reciprocated through said reference optical path once, so as to guide it to said reference reflector by way of said second relay polarization separator and said first ¼-wave plate; and wherein said second partial relay optical system includes a third relay polarization separator disposed in the optical path between said measurement reflector and said main polarization separator, a second ¼-wave plate disposed in the optical path between said third relay polarization separator and said measurement reflector, and a fourth relay reflector for reflecting said measurement light, which has arrived there by way of said third relay polarization separator after having reciprocated through said measurement optical path once, so as to guide it to said measurement reflector by way of said third relay polarization separator and said second ¼-wave plate.

15. An apparatus according to claim 14, wherein said the first partial relay optical system further comprises a third eliminating mechanism for eliminating stray light mixed into the reference optical propagated through the light path between said second relay polarization separator and said third relay reflector; and wherein said second partial relay optical system comprises a fourth eliminating mechanism for eliminating stray light mixed into the measurement optical propagated through the light path between said third relay polarization separator and said fourth relay reflector.

16. An apparatus according to claim 15, wherein said third eliminating mechanism comprises a polarization beam splitter for guiding, to the outside of a predetermined optical path, the stray light which has arrived there by way of said second relay polarization separator; and wherein said fourth eliminating mechanism comprises a polarization beam splitter for guiding, to the outside of a predetermined optical path, the stray light which has arrived there by way of said third relay polarization separator.

17. An apparatus according to claim 1, wherein said first light includes light components which respectively have frequencies $\omega_1$ and $\omega_{1a}$ slightly different from each other and whose polarization directions are orthogonal to each other, whereby said first light incident on said main polarization separator is separated into light with said frequency $\omega_1$, which becomes said first measurement light component, and light with said frequency $\omega_{1a}$, which becomes said first reference light component.

18. An apparatus according to claim 1, wherein said light emitting system comprises:
 a first light source section for outputting said first light;
 a second light source section for outputting said second light and said third light; and
 a frequency coupling device for coupling said second light and third light from said second light source section and said first light from said first light source section together so as to guide them onto an identical optical path.

19. An apparatus according to claim 18, wherein said second light source section comprises a light source for outputting said second light and a first frequency converter for converting a part of said second light from said light source into a harmonic wave and outputting said harmonic wave as said third light;

wherein said second interference light generating system comprises a second frequency converter for converting said second measurement light component, which has been propagated through said measurement optical path, into a harmonic wave; and wherein said third interference light generating system comprises a third frequency converter for converting said second reference light component, which has been propagated through said reference optical path, into a harmonic wave.

20. An apparatus according to claim 18, wherein said second light source section further comprises a frequency shifting section for slightly shifting the frequency of at least one of said second light and third light.

21. An apparatus according to claim 1, wherein at least one of said measurement reflector and reference reflector includes a plane mirror.

22. An apparatus according to claim 1, wherein said light emitting system comprises a third light source section for outputting a selected one of said second light and third light together with said first light, said selected one of said second and third light has a frequency that substantially coincides with the frequency of said first light.

23. A method in which measurement light propagated through a measurement optical path including a measurement reflector which is at least movable along said measurement optical path and reference light propagated through a reference optical path including a fixed reference reflector are made to interfere with each other so as to measure a displacement of said measurement reflector, said method comprising the steps of:

emitting, along an identical optical path, first light having a predetermined frequency and second light and third light respectively having frequencies which are different from each other;

dividing said first light into a first measurement light component included in said measurement light introduced into said measurement optical path and a first reference light component included in said reference light introduced into said reference optical path which are polarized light components different from each other, dividing said second light into a second measurement light component included in said measurement light and a second reference light component included in said reference light which are polarized light components different from each other, and dividing said third light into a third measurement light component included in said measurement light and a third reference light component included in said reference light which are polarized light components different from each other;

guiding the measurement light propagated through said measurement optical path and the reference light propagated through said reference optical path while spatially separating them from each other and then separating, in terms of frequency, said measurement light into said first measurement light component and said second and third measurement light components, while separating, in terms of frequency, said reference light into said first reference light component and said second and third reference light components;

generating first interference light from said first reference light component and said first measurement light component, second interference light by converting one of the frequencies of said second measurement light component and said third measurement light component so as to substantially coincide with the other of the frequencies of said second measurement light component frequency and third measurement light component, and third interference light by converting one of the frequencies of said second reference light component and third reference light component so as to substantially coincide with the other of the frequencies of said second reference light component and said third reference light component; and correcting information about displacement of said measurement reflector obtained from said first interference light so as to determine an amount of displacement of said measurement reflector, based on information about fluctuation in refractive index in said measurement optical path and reference optical path measured from said second interference light and third interference light.

24. A method according to claim 23, wherein one of said second light and third light has a frequency identical to the frequency of said first light and is supplied from a light source which supplies said first light.

25. An optical interference measuring apparatus for measuring displacement of an object in which a measurement light is propagated through a measurement light optical path, which includes a measurement reflector that is at least movable along the measurement light optical path, having a reference light which is propagated through a reference light optical path that includes at least a fixed reference reflector, the measurement light and reference light being made to interfere with each other so as to measure a displacement of the measurement reflector, said apparatus comprising:

light emitting means for emitting a plurality of lights along optical paths, wherein the plurality of lights include a first light having a primary predetermined frequency, a second light and a third light, said second and third lights respectively having frequencies which are different from each other;

main polarization separator means for separating said first, second, and third lights into light components, said main polarization separator means (i) separating said first light into a first measurement light component, included in said measurement light introduced into the measurement light optical path, and a first reference light component, included in the reference light introduced into the reference light optical path, the first measurement and reference light components being polarized differently from each other, and (ii) separating said second light into a second measurement light component, included in said measurement light, and a second reference light component, included in said reference light, the second measurement and reference light components being polarized differently from each other, and (iii) separating said third light into a third measurement light component, included in said measurement light, and a third reference light component, included in the reference light, the third measurement and reference light components being polarized differently from each other;

frequency separating means for separating, in terms of frequency, the measurement light propagated through the measurement light optical path into the first measurement light component and the second and third measurement light components, and for separating, in terms of frequency, the reference light propagated through the reference light optical path into the first reference light component and the second and third reference light components;

first interference light generating means for generating a first interference light from the first reference light component and the first measurement light component;

second interference light generating means for generating a second interference light by selecting and converting one of the frequencies of the second measurement light component and the third measurement light component to substantially coincide with the frequency of the non-selected one of the second measurement light component and the third measurement light component;

third interference light generating means for generating a third interference light by selecting and converting one of frequencies of the second reference light component and the third reference light component to substantially coincide with the frequency of the non-selected one of the second reference light component and the third reference light component;

optical path separating means for spatially separating the optical paths of the measurement light optical path and the reference light optical path, with respect to at least the second light and third light, wherein at least a portion of the optical path of the measurement light, to be converted by said second interference light generating means after being propagated through the measurement light optical path, and at least a portion of the optical path of the reference light to be converted by said third interference light generating means after being propagated through said reference light optical path, are spatially separated from each other; and correction means for correcting information about displacement of the measurement reflector, the information being obtained from the generated first interference light, wherein said correction means corrects information by calculating fluctuation in the refractive index of the atmosphere along the measurement light optical path and the reference light optical path, the fluctuation being calculated from the generated second interference light and the generated third interference light.

26. An apparatus according to claim 25, further comprising relay optical means for reciprocating the reference light containing said first, second, and third reference light components along the reference optical path a plurality of times, and reciprocating the measurement light containing said first, second, and third measurement light components along the measurement optical path the same number of times as said reference light reciprocates along the reference optical path.

27. An apparatus according to claim 26,
wherein said relay optical means further comprises:
partial relay optical means for reflecting the reference light, which has reciprocated through the reference optical path at least once, so as to guide it to the reference reflector without it passing through said main polarization separator means, and for reflecting the measurement light, which has reciprocated through the measurement optical path at least once, so as to guide it to said measurement reflector without it passing through said main polarization separator means.

28. An apparatus according to claim 25, wherein the first light includes light components which respectively have frequencies $\omega_1$ and $\omega_{1a}$ slightly different from each other and whose polarization directions are orthogonal to each other, whereby the first light separated by said main polarization separator means is separated into light with said frequency $\omega_1$, which becomes the first measurement light component, and light with said frequency $\omega_{1a}$, which becomes said first reference light component, and, wherein said light emitting means further comprises:
a first light source section for outputting said first light;
a second light source section for outputting said second light and said third light; and
frequency coupling means for coupling said second light and said third light, from said second light source section, and said first light, from said first light source section, together so as to guide them onto an identical optical path.

29. An apparatus according to claim 25, wherein said optical path separating means includes the measurement reflector and the reference reflector which are disposed at positions where the measurement light separated by said main polarization separator means and the reference light separated by said main polarization separator means are spatially separated from each other, whereby the measurement light and the reference light emitted from said main polarization separator means are independent from each other and enter said frequency separating means along optical paths spatially separated from each other;

wherein said frequency separating means comprises:
a first frequency separator for separating, in terms of frequency, the reference light propagated through the reference optical path, into said first reference light component and into said second and third reference light components, and a second frequency separator for separating, in terms of frequency, the measurement light propagated through said measurement optical path into said first measurement light component and into said second and third measurement light components, wherein at least one of said first frequency separator and said second frequency separator are disposed in an optical path upstream of a point where said first light, propagated through said reference optical path, and said first light, propagated through said measurement optical path, are substantially coupled together, and said first frequency separator includes a dichroic mirror which has a characteristic such that said second and third reference light components in said reference light, reflected by said reference reflector, are reflected thereby, while said first reference light component in said reference light is transmitted therethrough, wherein said second frequency separator includes a dichroic mirror which is disposed in an optical path of the measurement light reflected by said measurement reflector and has a characteristic such that said second and third measurement light components in said measurement light are reflected thereby, while said first measurement light component in said measurement light is transmitted therethrough.

* * * * *